United States Patent [19]
Kayada

[11] Patent Number: 5,719,906
[45] Date of Patent: Feb. 17, 1998

[54] SIGNAL GENERATOR AND WIRELESS MOBILE SYSTEM INCLUDING THE SAME

[75] Inventor: Tadashi Kayada, Yokohama, Japan

[73] Assignee: Matsushita Electric Industrial Co., Ltd., Osaka, Japan

[21] Appl. No.: 420,154

[22] Filed: Apr. 11, 1995

[30] Foreign Application Priority Data

Apr. 22, 1994 [JP] Japan .................................. 6-106332
Oct. 18, 1994 [JP] Japan .................................. 6-277246

[51] Int. Cl.$^6$ ................................................. H04L 7/00
[52] U.S. Cl. ........................... 375/354; 370/458; 370/508
[58] Field of Search .................................... 375/354, 355;
370/95.1, 95.3, 294, 321, 337, 347, 442,
458, 508; 327/151, 160, 153, 161, 241,
248, 265, 270, 273, 279

[56] References Cited

U.S. PATENT DOCUMENTS

| | | | |
|---|---|---|---|
| 4,295,098 | 10/1981 | Crowley | 327/241 |
| 4,642,806 | 2/1987 | Hewitt et al. | 370/95 |
| 5,363,373 | 11/1994 | Nakahara et al. | 370/95.1 |

FOREIGN PATENT DOCUMENTS

| | | |
|---|---|---|
| 394303A | 4/1991 | Japan. |
| 5244145A | 9/1993 | Japan. |

*Primary Examiner*—Stephen Chin
*Assistant Examiner*—Kevin Kim
*Attorney, Agent, or Firm*—Watson Cole Stevens Davis, P.L.L.C.

[57] ABSTRACT

A signal generating apparatus generates four sets of signals whose rising timing and falling timing are controlled. One signal among the four signals is produced by employing a first sequence control unit, a first coincidence detecting unit, a second coincidence detecting unit, and a first output controlling unit. A timer increments a count value in response to a timer increment signal to produce a timer output value. The first sequence controlling unit produces two correction values obtained by correcting the timer output value inputted from the timer. The first coincidence detecting unit outputs a coincidence detection pulse when the correction value inputted from the first sequence control unit is coincident with the internally set set value. The second coincidence detecting unit outputs another coincidence detection pulse when the correction value inputted from the first sequence control unit is coincident with the internally set set value. The first output controlling unit controls the rising timing of the signal in response to the coincidence detection pulse inputted from the first coincidence detecting unit, and also controls the falling timing of the signal in response to another coincidence detection pulse inputted from said second coincidence detecting unit.

33 Claims, 21 Drawing Sheets

SIGNAL GENERATOR AND WIRELESS MOBILE SYSTEM INCLUDING THE SAME

BACKGROUND OF THE INVENTION

1. Field of the Invention

The present invention generally relates to a signal generator and a wireless (radio) mobile system including such a signal generator. More specifically, the present invention is directed to a signal generator used to control TDMA (Time Division Multiple Access) type digital portable telephones, for generating signals at timings set within a constant time period, while easily controlling the timings of plural signals, and also to a radio mobile system employing such a general generator.

2. Description of the Related Art

Most of control apparatuses require that signals are produced at timings preset within a constant time period. As a signal generating apparatus capable of generating a signal at a preset timing, there are typically two different types of signal generating apparatuses, i.e., one signal generating apparatus constructed by employing only the hardware, and the other signal generating apparatus by employing the hardware and the software. In comparison as to the circuit scale and the power consumption, the former hardware signal generator is superior to the latter hardware/software signal generator.

FIG. 22 schematically shows one example of the conventional signal generating apparatus constructed of only the hardware, for generating two sets of signals "E" and "F" at preselected timings. This conventional hardware signal generating apparatus is arranged by the timer 21 for counting time at a constant time period in response to the timer increment signal 22, the signal line constructed of a plurality of bit lines indicating the output value "r" of the timer 21, and the first to fourth coincidence detecting units 23 to 26 for comparing the output value of the timer 21 with the desired producing timing set in the internal data register to produce the coincidence detecting pulses s, t, u, v when the coincidence between them is made. This signal generating apparatus further includes the first and second output controlling units 27 and 28 for producing the signals "E" and "F" at the predetermined timings by using the coincidence detecting pulses s, t indicative of the timing producing commencements, outputted from the first and third coincidence detecting units 23, 24, and also the coincidence detecting pulses u, v representative of the timing producing completion, outputted from the second and fourth coincidence detecting units 25, 26.

It should be understood that although this conventional signal generating apparatus shown in FIG. 22 generates the two signals "E" and "F" at the predetermined timings, the total number of these coincidence detecting units and output controlling units may be further increased in order that a large number of signals at the preselected timings are produced.

Subsequently, the operations of this conventional signal generating apparatus will now be described. FIG. 23 shows timing chart of this signal generating apparatus. The waveform of the output value "r" from the timer 21 is represented such that a change in the output values of this timer 21 is indicated in the ordinate when the time is indicated in the abscissa, and the count value of the timer 21 is counted up while the time elapses. It should be noted that since this counting up operation is digitally performed, this waveform of the timer output has actually a step shape, but this waveform is indicated in a straight line form for the sake of image representation.

The first to fourth coincidence detecting units 23 to 26 produce the coincidence detecting pulses s, t, u, v when the output value "r" of the timer 21 is coincident with the values set in the respective coincidence detecting units 23 to 26. The coincidence detecting pulses s, u outputted from the first and second coincidence detecting units 23 and 25 are entered into the first output controlling unit 27. The first output controlling unit 27 controls the rising portion of the signal "E" based on this coincidence detecting pulse s, and also controls the falling portion of this signal "E" based upon the coincidence detecting pulse u, so that the signal "E" is produced. The coincidence detection pulses t and V outputted from the third and fourth coincidence detecting units 24 and 26 are entered into the second output controlling unit 28. The second output controlling unit 28 controls the rising portion of the signal "F" based on the coincidence detecting pulse t, and the falling portion of this signal based upon the coincidence detecting pulse v.

In case that the producing positions of the signals "E" and "F" are varied, the positional data, which are used to detect the coincidence and have been stored in the data registers provided inside the respective coincidence detecting units 23 to 26, is changed, so that the generation timings of the signals may be freely set.

However, the conventional signal generating apparatus has a problem. That is, when the generation timings of the plural signals are shifted by the same time amount at the same time, and also the generation time periods of the plural signals are simultaneously shifted by the same amount, such a control operation is necessarily required that both of the generating position and the generation ending position with respect to each of the plural signals are written into the registers employed in the coincidence detecting units. As a result, when the total number of signals generated from this conventional signal generating apparatus is increased, the more complex signal controlling operations would be required.

SUMMARY OF THE INVENTION

The present invention has been made to solve these problems of the conventional signal generating apparatus, and therefore has an object to provide such a signal generating apparatus capable of effectively controlling both generation timings and generation ending timings for a large number of signals.

A first signal generating apparatus of the present invention is such a signal generating apparatus for generating a signal whose generation starting timing and generation ending timing are controlled, and comprises:

a timer for producing a timer output value by incrementing or decrementing a count value in response to a clock signal;

control means for correcting said timer output value inputted from said timer to produce a correction value;

coincidence detecting means into which a predetermined set value is set, for outputting a coincidence detecting pulse when said correction value inputted from said control means is coincident with said set value; and output control means for controlling the generation starting timing and the generation ending timing of said signal in response to said coincidence detection pulse inputted from said coincidence detecting means.

In the first signal generating apparatus of the present invention, said control means includes first and second correction means for producing first and second correction values different from each other by correcting said timer output value;

said coincidence detecting means outputs said coincidence detection pulses corresponding to said first and second correction values inputted from said control means, respectively; and said output control means controls the generation starting timing of said signal based on the coincidence detection pulse corresponding to said first correction value which is inputted from said coincidence detecting means, and also controls the generation ending timing of said signal based upon the coincidence detection pulse corresponding to said second correction value which is inputted from said coincidence detecting means.

Furthermore, in the first signal generating apparatus of the present invention, said first correction means includes:

a first register for storing a first predetermined other set value; and a first subtracter for subtracting said first predetermined other set value inputted from said first register from said timer output value inputted from said timer to produce said first correction value; and said second correction means includes:

a second register for storing a second predetermined other set value; and a second subtracter for subtracting said second predetermined other set value inputted from said second register from said timer output value inputted from said timer to produce said second correction value.

As a consequence, in the first signal generating apparatus of the present invention, when a plurality of signals are generated, for example, the first other set value stored in the first register and the second other set value stored in the second register are varied, and the correcting manner of the timer output value performed by the control means is changed. The generation positions of the plural signals can be simultaneously shifted by the same time, and also the generation periods of the plural signals can be simultaneously shifted by the same time.

A second signal generating apparatus of the present invention is featured by that said correction means receives as an input value the output value of said first correction means.

Accordingly in the second signal generating apparatus of the present invention, when a plurality of signals are generated, only the generation positions of the plural signals can be simultaneously changed without changing the generation periods of the plural signals.

A third signal generating apparatus of the present invention further comprises synchronization control means for resetting a count value of said timer in order that the count value of said timer is synchronized with an external condition.

As a result, in the third signal generating apparatus of the present invention, when a plurality of signals are generated, the synchronization control means resets the count value of the timer in adaptation to the external condition so as to correct the count value of the timer, so that the generation timings of all signals can be simultaneously changed.

A fourth signal generating apparatus of the present invention comprises a plurality of said control means and said coincidence detecting means; and a set-value supply register for supplying said predetermined set value; and when said correction value inputted from corresponding one of said plural control means is coincidence with said set value inputted from said set-value supply register, each of said coincidence detecting means outputs a coincidence detection pulse.

As a consequence, in the fourth signal generating apparatus of the present invention, since a plurality of coincidence detecting means for generating a plurality of signals commonly use the set value supply register, the timings of the plural signals generated in the different sequences can be simultaneously changed by merely changing the predetermined set value which is supplied from the set value supply register to the respective coincidence detecting means.

A fifth signal generating apparatus of the present invention further comprises: a plurality of said output control means; and logic operation means for performing a logic operation of signals outputted from more than two arbitrary output control means among said plural output control means.

Accordingly, in the fifth signal generating apparatus of the present invention, for instance, the signals outputted from a plurality of output controlling means are OR-gated, or AND-gated, so that it is possible to produce such signals which raise at several times at a preselected timing during a predetermined time period.

A sixth signal generating apparatus according to the present invention further comprises clock generating means for generating a clock signal; and clock logic operation means for performing a logic operation between the signal outputted from said output control means and said clock signal outputted from said clock generating means.

As a result, in the sixth signal generating apparatus of the present invention, for instance, the clock logic operation means OR-gates, or AND-gates the signal outputted from the output control means and the clock signal outputted from the clock generating means, so that the clock signal can be outputted during only such a time period when the signal outputted from the output control means becomes high, or low.

In a seventh signal generating apparatus of the present invention, said output control means includes a reset pulse register for outputting a reset pulse when a predetermined numeral value is written;

starts to generate said signal when said coincidence detection pulse is inputted from said coincidence detecting means; and completes to generate said signal when said reset pulse is outputted from said reset pulse register.

As a consequence, in the seventh signal generating apparatus of the present invention, since the generation of the signal is commenced in response to the coincidence detection pulse derived from the coincidence detecting means and also the generation of the signal is ended in response to the reset pulse derived from the reset pulse register, for instance, this seventh signal generating apparatus of the present invention may be utilized so as to periodically produce the interrupt signal to the CPU. In this case, for example, the CPU writes "o" into the reset pulse register when the interrupt process is completed, thereby outputting the reset pulse. Thus, the generation of this interrupt signal is ended.

A wireless mobile apparatus according to the present invention is a wireless mobile apparatus for transmitting/receiving a signal to/from a base station system. This wireless mobile apparatus comprises:

receiving means for receiving a signal which contains a baseband signal and is transmitted from said base station system, and for extracting the baseband signal from the received signal;

demodulating means for demodulating said extracted baseband signal to reproduce a data series synchronized with said base station system;

error correction decoding means for error-correction-decoding said reproduced data series;

audio decoding means for decoding audio data when said error-correction decoded data series is such audio data;

D/A converting means for D/A-converting said decoded audio data into an audio signal;

speaker means for outputting said converted audio signal as voice;

a microphone for converting voice into an audio signal;

A/D converting means for A/D-converting said converted audio signal into audio data;

audio coding means for coding said converted audio data;

error correction coding means for error-correction coding said coded audio data;

modulating means for modulating said error-correction coded audio data with a transmission carrier;

transmitting means for transmitting said modulated audio data to said base station system;

signal generating means for generating a timing signal used to a transmitting/receiving operation of said wireless mobile apparatus;

a central processing unit for controlling the transmitting/receiving operation of said wireless mobile apparatus; and a memory for storing therein command data and control data used to said central processing unit; wherein:

said signal generating means is one of the first to seventh signal generating means of the present invention.

DETAILED DESCRIPTION OF THE PREFERRED EMBODIMENTS (FIRST EMBODIMENT)

Figure 1:
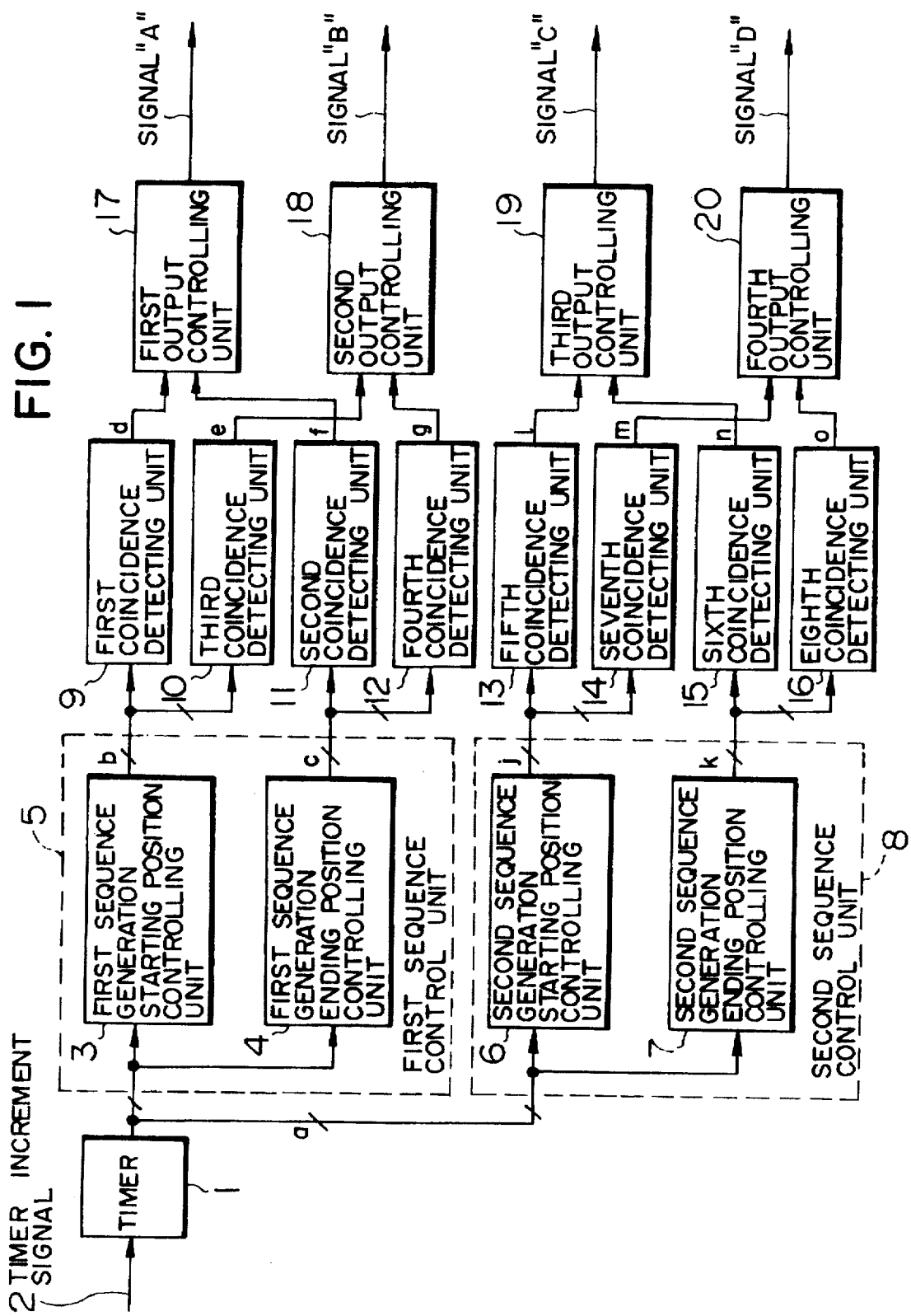
FIG. 1 is a schematic block diagram for indicating an arrangement of a signal generating apparatus according to a first embodiment of the present invention.

As indicated in FIG. 1, a signal generating apparatus for generating four sets of signals "A", "B", "C", "D", according to a first embodiment of the present invention, is comprised of a reference time timer 1 whose counting value is incremented in response to an externally supplied reference clock signals (timer increment signal 2), and a first sequence control unit 5 for controlling both of signal generation starting positions and signal generation ending positions for the two signals "A" and "B" at the same time while the two sets of signals "A" and "B" among the signals "A", "B", "C", "D" are handled as one group (as a first sequence). This signal generating apparatus further includes a second sequence control unit 8 for simultaneously controlling both the signal generation starting position and the signal generation ending position of the signals "C" and "D" while the signals "C" and "D" are handled as one group (a second sequence). The first sequence control unit 5 is arranged by a first sequence generation starting position controlling unit 3 for controlling the output value of the timer 1 to output a correction value "b" so as to control the first sequence generation starting position, and a first sequence generation ending position controlling unit 4 for controlling the output value of the timer 1 to output another correction value "c" so as to control the first sequence generation ending position. The second sequence control unit 8 includes a second sequence generation starting position controlling unit 6 for controlling the output value of the timer 1 to output another correction value "j" in order to control the second sequence generation starting position, and a second sequence generation ending position controlling unit 7 for controlling the output of the timer 1 to output another correction value "k" in order to control the second sequence generation ending position.

The signal generating apparatus is arranged by a first coincidence detecting unit 9 for comparing the setting position of starting the generation of the signal "A" with the correction value "b" of the timer 1 and for producing a coincidence detection pulse "d" when both values are coincident with each other, a second coincidence detecting unit 11 for comparing the setting position of ending the generation of the signal "A" with the correction value "c" and for producing a coincidence detection pulse "f" when both values are made coincident with each other, and further a first output controlling unit 17 for controlling a rising portion of the signal "A" and a falling portion thereof in response to the generation starting coincidence detection pulse "d" outputted from the first coincidence detecting unit 9 and the generation ending coincidence detection pulse "f" outputted from the second coincidence detecting unit 11, thereby producing the signal "A". The signal generating apparatus further includes a third coincidence detecting unit 10 for comparing the setting position of starting the generation of the signal "B" with the correction value "b" of the timer 1 and for producing a coincidence detection pulse "e" when both values are coincident with each other, a fourth coincidence detecting unit 12 for comparing the setting position of ending the generation of the signal "B" with the correction value "c" of the timer 1 and for producing a coincidence detection pulse "g" when both values are coincident with each other, and a second output controlling unit 18 for controlling a rising portion of the signal "B" and a falling portion thereof in response to the generation starting coincidence detection pulse "e" outputted from the third coincidence detecting unit 10 and the generation ending coincidence detection pulse "g" outputted from the four coincidence detecting unit 12, thereby producing the signal "B". The signal generating apparatus is further comprised of a fifth coincidence detection unit 13 for comparing the setting position of starting the generation of the signal "C" with the correction value "j" of the timer 1 and for producing a coincidence detection pulse "l" when both values are coincident with each other, a sixth coincidence detecting unit 15 for comparing the setting position of ending the generation of the signal "C" with the correction value "k" and for producing a coincidence detection pulse "n" when both values are made coincident with each other, and further a third output controlling unit 19 for controlling a rising portion of the signal "C" and a falling portion thereof in response to the generation starting coincidence detection pulse "l" outputted from the fifth coincidence detecting unit 13 and the generation ending coincidence detection pulse "n" outputted from the sixth coincidence detecting unit 15, thereby producing the signal "C". The signal generating apparatus further includes a seventh coincidence detecting unit 14 for comparing the setting position of starting the generation of the signal "D" with the correction value "j" of the timer 1 and for producing a coincidence detection pulse "m" when both values are coincident with each other, an eighth coincidence detecting unit 16 for comparing the setting position of ending the generation of the signal "D" with the correction value "k" of the timer 1 and for producing a coincidence detection pulse "o" when both values are coincident with each other, and a fourth output controlling unit 20 for controlling a rising portion of the signal "D" and a falling portion thereof in response to the generation starting coincidence detection pulse "m" outputted from the seventh coincidence detecting unit 14 and the generation ending coincidence detection pulse "o" outputted from the eighth coincidence detecting unit 16, thereby producing the signal "D".

Figure 2:
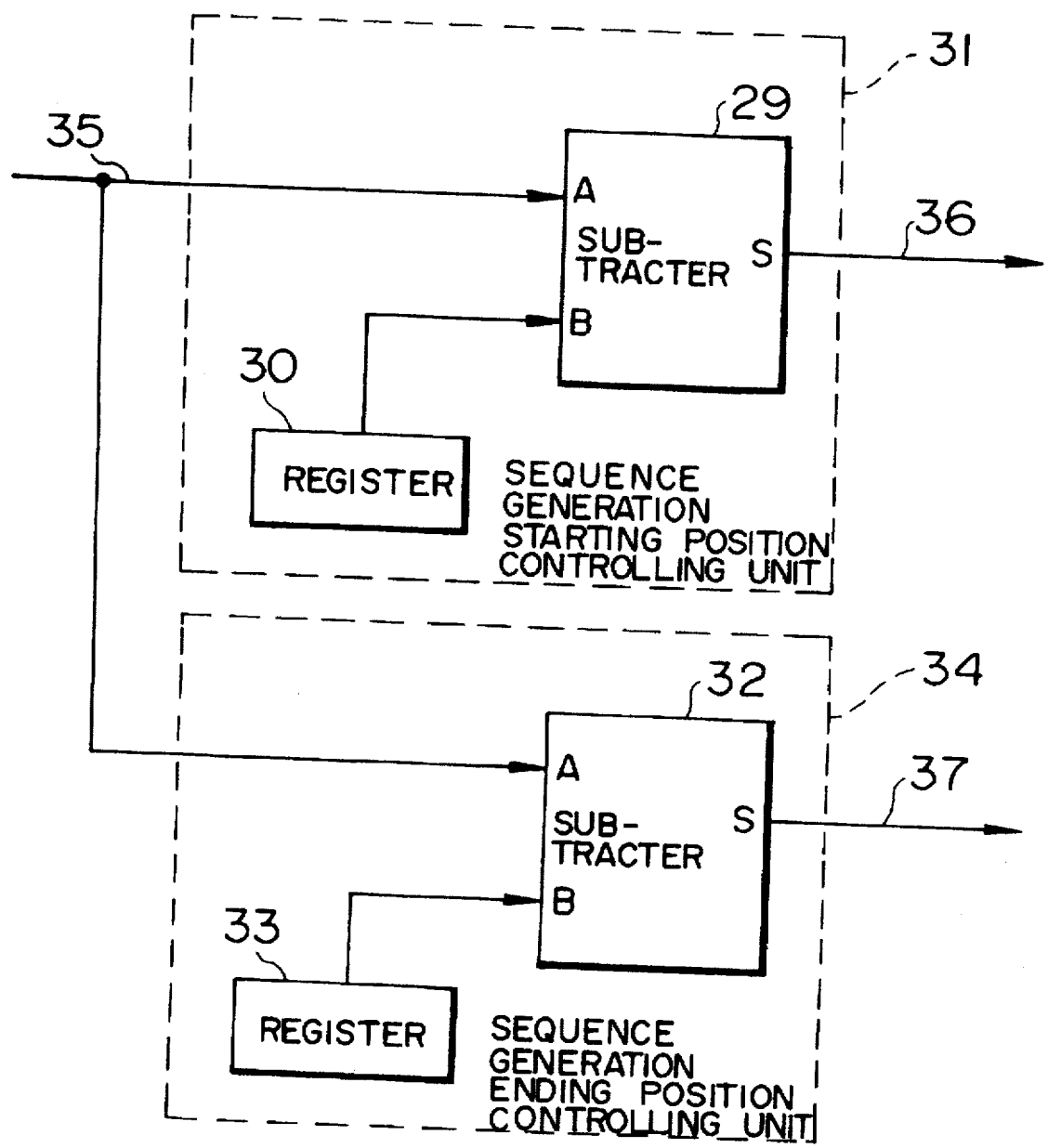
FIG. 2 is a schematic block diagram for showing a concrete arrangement of a sequence control unit employed in the signal generating apparatus of the first embodiment.

As represented in a sequence generation starting position controlling unit 31 of FIG. 2, each of the first sequence generation starting position controlling unit 3 employed in the first sequence control unit 5, and the second sequence generation starting position controlling unit 6 employed in the second sequence control unit 8 includes a register 30 for setting the sequence generation starting position, and a subtracter 29 for subtracting the set value of the register 30 from an input signal indicative of the value of the timer 1 (timer output signal 35). As illustrated in a sequence generation ending position controlling unit 34 of FIG. 2, each of the first sequence generation ending position controlling unit 4 employed in the first sequence control unit 5 and the second sequence generation ending position controlling unit 7 employed in the second sequence control unit 8 includes a register 33 for setting the sequence generation ending position, and a subtracter 32 for subtracting the set value of the register 33 from the timer output signal 35.

Figure 3:
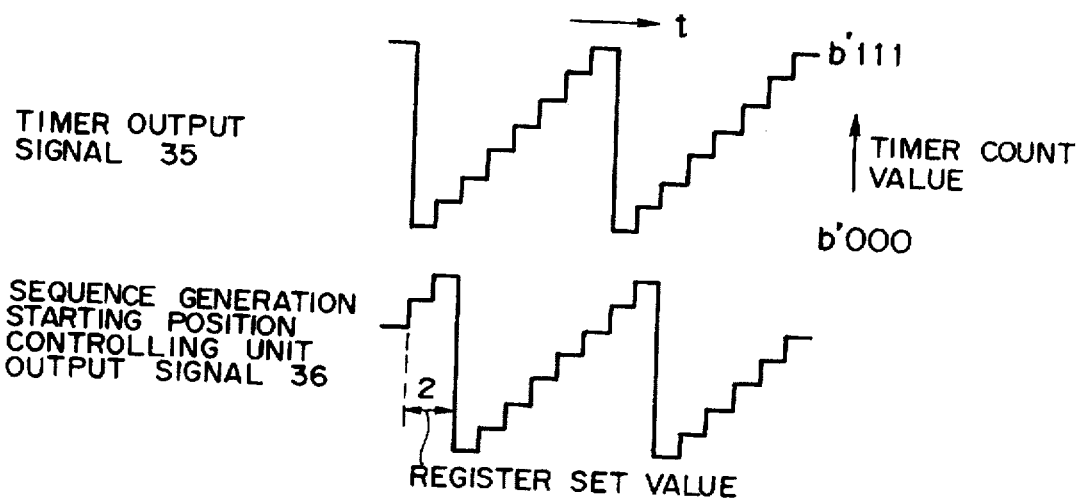
FIG. 3 is a timing chart for explaining operation of the sequence control unit shown in FIG. 2.

The first sequence control unit 5 of the second sequence control unit 8 corrects the value of the timer 1 as shown in FIG. 3. For the sake of simple explanation, it is assumed that the value of the timer 1 is indicated by 3 bits. The timer 1 shown in FIG. 1 starts its counting operation from "000", and then increments the count value by "1" every time one clock of the timer increment signal 2 is supplied. When the counting value reaches "111", this counting value is returned to "000". That is, the timer 1 outputs such a periodical counting value. Assuming now that the set value of the register 30 employed in the sequence generation starting position controlling unit 31 shown in FIG. 2 is equal to "2", since the subtracter 29 subtracts the set value "2" of the register 30 from the timer output signal 35 to output the subtraction value, an output signal 36 of the sequence generation starting position controlling unit is such a signal delayed by 2 clocks from the timer output signal 35. As a consequence, from the first and third coincidence detecting units 9 and 10 connected to the first sequence generation starting position controlling unit 3 of the first sequence control unit 5, and also the fifth and seventh coincidence detecting units 13 and 15 connected to the second sequence generation starting position controlling unit 6 of the second control unit 8, the respective coincidence detection pulses d, e, l, m are produced which each is delayed by 2 clocks with respect to the output signal of the timer 1.

As a consequence, both the first sequence generation starting position controlling unit 3 and the second sequence generation starting position controlling unit 6 may delay and advance (quicken) the output signal from the timer 1 in response to the set value of the register. Similarly, both the first sequence generation ending position controlling unit 4 of the first sequence control unit 5 and the second sequence generation ending position controlling unit 7 of the second sequence control unit 8 may delay and advance the output signal of the timer 1 in accordance with the set value of the register (register 33). It should be noted that when the sequence generation starting positions and the sequence generation ending positions of the respective signals "A" to "D" are previously fixed, instead of the registers 30 and 33 shown in FIG. 2, circuits for setting the fixed value may be employed in the first sequence generation starting position controlling unit 3, the second sequence generation stating position controlling unit 6, the first sequence generation ending position controlling unit 4, and the second sequence generation ending position controlling unit 7.

Next, operations Of the signal generating apparatus according to the first embodiment of the present invention will now be described with reference to a timing chart of FIG. 4. For the sake of simplicity, this timing chart represents only the operations to generate the signal "A" and the signal "B" of the first sequence. An output value "a" of the timer 1 is inputted into the first sequence generation starting position controlling unit 3. The first sequence generation starting position controlling unit 3 delays this output value "a" of the timer 1 by time "y" to output a correction value "b". Also, the output value "a" of the timer 1 is inputted to the first sequence generation ending position controlling unit 4. The first sequence generation ending position controlling unit 4 outputs such a correction value "c" obtained by delaying the output value "a" of the timer 1 by time "zz".

The correction value "b" outputted from the first sequence generation starting position controlling unit 3 is entered into the first coincidence detecting unit 9 and the third coincidence detecting unit 10, which control the generation starting positions of the signals "A" and "B", respectively. When this correction value "b" is coincident with the generation starting position data of the signal "A" internally set, the first coincidence detecting unit 9 outputs the coincidence detection pulse "d" to the first output controlling unit 17. When this correction value "b" is coincident with the generation starting position data of the signal "B" internally set, the third coincidence detecting unit 10 outputs the coincidence detection pulse "e" to the second output controlling unit 18. In response to the coincidence detection pulse "d", the first output controlling unit 17 controls the rising portion of the signal "A". In response to the coincidence detection pulse "e", the second output controlling unit 18 controls the rising portion of the signal "B".

The correction value "c" outputted from the first sequence generation ending position controlling unit 4 is entered into the second coincidence detecting unit 11 and the fourth coincidence detecting unit 12, which control the generation ending positions of the signals "A" and "B", respectively. When this correction value "c" is coincident with the generation ending position data of the signal "A" internally set, the second coincidence detecting unit 11 outputs the coincidence detection pulse "f" to the first output controlling unit 17. When this correction value "c" is coincident with the generation ending position data of the signal "B" internally set, the fourth coincidence detecting unit 12 outputs the coincidence detection pulse "g" to the second output controlling unit 18. In response to the coincidence detection pulse "f", the first output controlling unit 17 controls the falling portion of the signal "A". In response to the coincidence detection pulse "g", the second output controlling unit 18 controls the falling portion of the signal "B".

In this way, the signal "A" and the signal "B", the rising timing and the falling timing of which are controlled (namely, generation starting position and generation ending position are controlled) are outputted from the first output controlling unit 17 and the second output controlling unit 18, respectively.

The generation starting positions and the generation ending positions of the signal "A" and the signal "B" may be separately controlled by varying the data setting values used to determine the generation positions of the coincidence detection pulses "d" to "g" in the respective coincidence detecting units 9 to 12. In addition, the combination between the signal "A" and the signal "B" may be controlled in sequence unit by changing either the set value of the register 30 employed in the first sequence generation position controlling unit 3 of the first sequence control unit 5, or the set value of the register 33 employed in the first sequence generation ending position controlling unit 4.

It should also be noted that a total number of signals and also a total number of sequences may be freely increased/ decreased by changing the combinations of these sequence control unit, coincidence detecting unit, and output controlling unit. The various signal generating apparatuses may be constructed by employing optimum circuits thereof.

Figure 4:
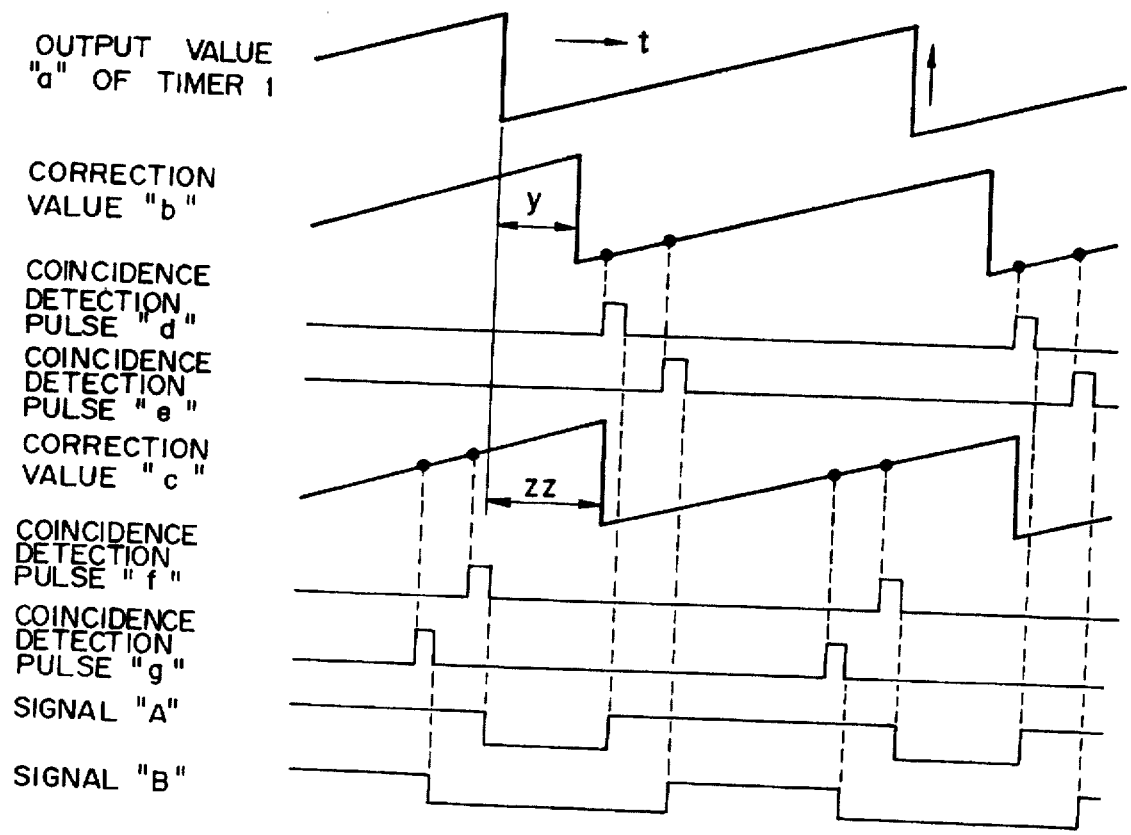
FIG. 4 is a timing chart for explaining operation of the signal generating apparatus according to the first embodiment.

Furthermore, it should be noted that in this embodiment, as shown in the timing chart of FIG. 4, the rising portions and falling portions of the signals "A" to "D" are made coincident with the falling portions of the coincidence detection pulses. Alternatively, the rising portions and falling portions of these signals "A" to "D" may be again synchronized with the timer increment signal 2 with employment of flip-flop circuits and the like.

Although the present embodiment has described such a timer operation (up-counter) that the counting value is incremented in response to the clock signal, a similar effect may be achieved even when a down-counter for decrementing a counting value in response to the clock signal is employed.

(SECOND EMBODIMENT)

Figure 5:
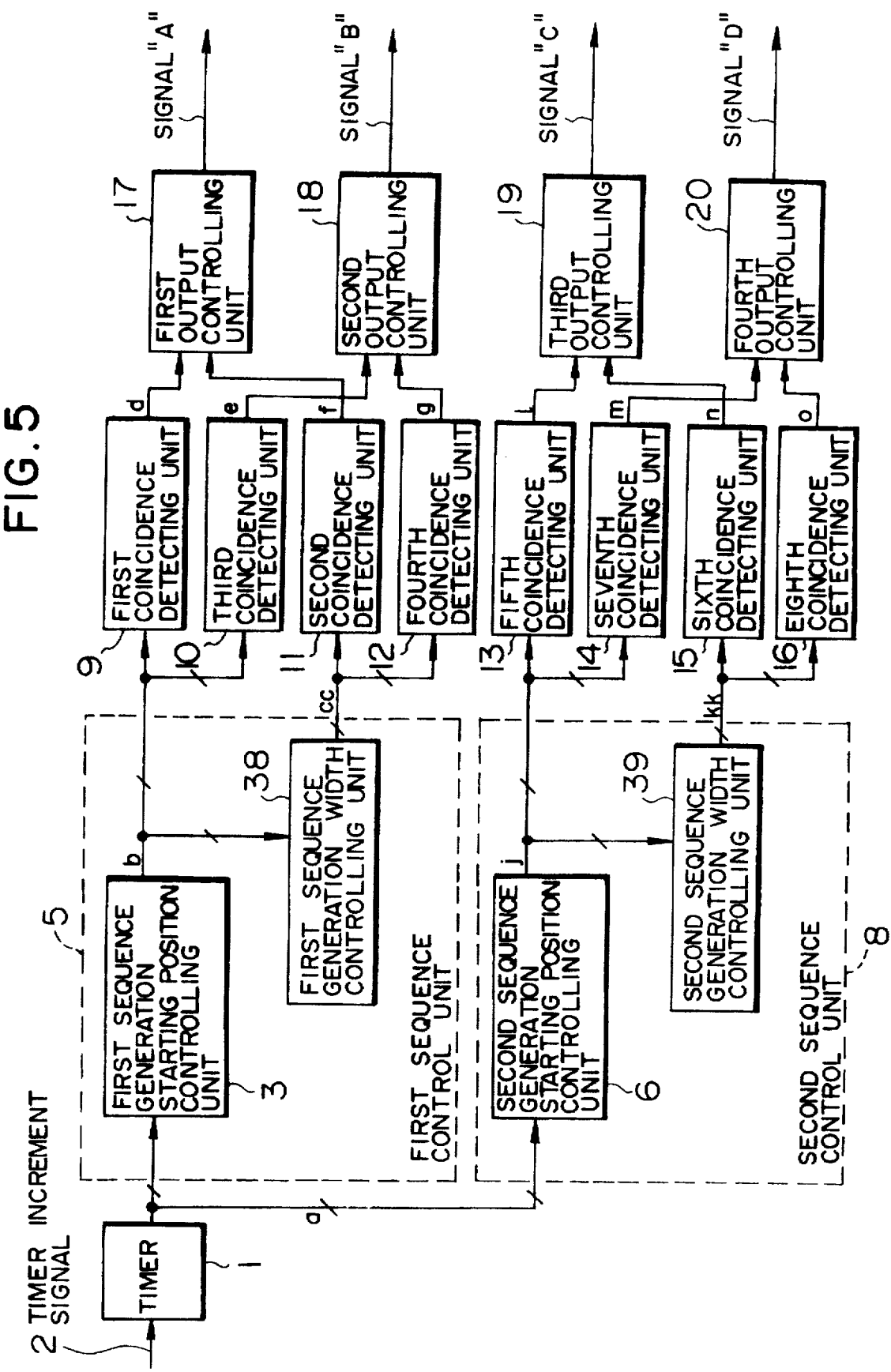
FIG. 5 is a schematic block diagram for representing an arrangement of a signal generating apparatus according to a second embodiment of the present invention.

As represented in FIG. 5, a signal generating apparatus according to a second embodiment of the present invention has a different arrangement from that of the signal generating apparatus according to the first embodiment of the present invention, shown in FIG. 1. That is, first, the first sequence control unit 5 includes a first sequence generation width controlling unit 38 instead of the first sequence generation ending position controlling unit 4. This first sequence generation width controlling unit 38 outputs a correction value "cc", which is obtained by further correcting the correction value "b" outputted from the first sequence generation starting position controlling unit 3, into the second and fourth coincidence detecting units 11 and 12. Secondly, the second sequence control unit 8 includes a second sequence generation width controlling unit 39 instead of the second sequence generation ending position controlling unit 7. This second sequence generation width controlling unit 39 outputs a correction value "kk", which is obtained by further correcting the correction value "j" outputted from the second sequence generation starting position controlling unit 6, into the sixth and eighth coincidence detecting units 15 and 16. It should be noted that each of the first sequence generation width controlling unit 38 and the second sequence generation width controlling unit 39 may be arranged by a subtracter and a register in a similar manner to the sequence generation ending position controlling unit 34 shown in FIG. 2.

Figure 6:
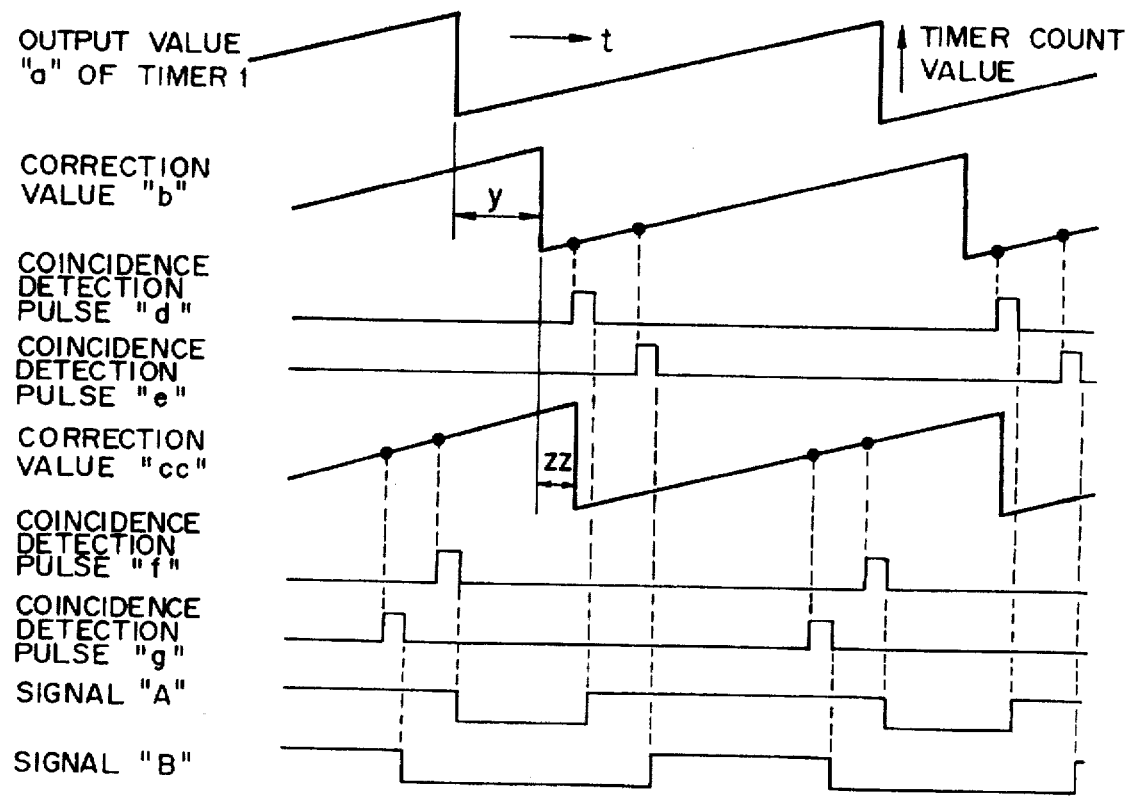
FIG. 6 is a timing chart for explaining operation of the signal generating apparatus according to the second embodiment.

Subsequently, operations of the signal generating apparatus according to the second embodiment will now be explained with reference to a timing chart of FIG. 6. In this timing chart, only generation operations of the signals "A" and "B" in the first sequence are illustrated, for the sake of simple explanation. The output value "a" of the timer 1 is inputted into the first sequence generation starting position controlling unit 3. The first sequence generation starting position controlling unit 3 outputs the correction value "b" obtained by delaying this output value "a" of the timer 1 by the time "y". Similar to the first embodiment, the first coincidence detecting unit 9 and the third coincidence detecting unit 10 supply the coincidence detection pulse "d", and the coincidence detection pulse "e" to the first output controlling unit 17 and the second output controlling unit 18, respectively. The first output controlling unit 17 and the second output controlling unit 18 controls the rising portion of the signal "A" and the rising portion of the signal "B" in response to the coincidence detection pulse "d" and the coincidence detection pulse "e", respectively.

The correction value "b" is also supplied to the first sequence generation width controlling unit 38. The first sequence generation width controlling unit 38 outputs a correction value "cc" obtained by delaying this correction value "b" by time "zz".

The correction value "cc" is inputted to the second coincidence detecting unit 11 and the fourth coincidence detecting unit 12, which control the generation ending positions of the signals "A" and "B", respectively. The second coincidence detecting unit 11 outputs the coincidence detection pulse "f" to the first output controlling unit 17 when the correction value "cc" is coincident with the internally set generation ending position data of the signal "A". The fourth coincidence detecting unit 12 outputs the coincidence detection pulse "g" to the second output controlling unit 18 when the correction value "cc" is coincident with the internally set generation ending position data of the signal "B". The first output controlling unit 17 control the falling portion of the signal "A" in response to the coincidence detection pulse "f", whereas the second output controlling unit 18 controls the falling portion of the signal "B" in response to the coincidence detection pulse "g".

In the signal generating apparatus according to the second embodiment, since the set value of the register 30 (see FIG. 2) employed in the first sequence generation starting position controlling unit 3 is changed, the generation starting positions of the signal "A" and the signal "B" can be simultaneously changed while the generation periods of the signals "A" and "B" (namely, the pulse widths of the signals "A" and "B") are maintained at constant values. Also, since the set value of the register 33 (see FIG. 2) employed in the first sequence generation width controlling unit 38 is changed, the generation periods of the signals "A" and "B" can be simultaneously varied while the generation starting positions of the signals "A" and "B" are kept constant. Further, since the set value of the register 30 (see FIG. 2) of the second sequence generation starting position controlling unit 6 is changed, the generation starting positions of the signal "C" and the signal "D" can be simultaneously changed while the generation periods of the signals "C" and "D" are maintained at constant values. Also, since the set value of the register 33 (see FIG. 2) employed in the second sequence generation width controlling unit 39 is changed, the generation periods of the signals "C" and "D" can be simultaneously varied while the generation starting positions of the signals "C" and "D" are kept constant.

(THIRD EMBODIMENT)

Figure 7:
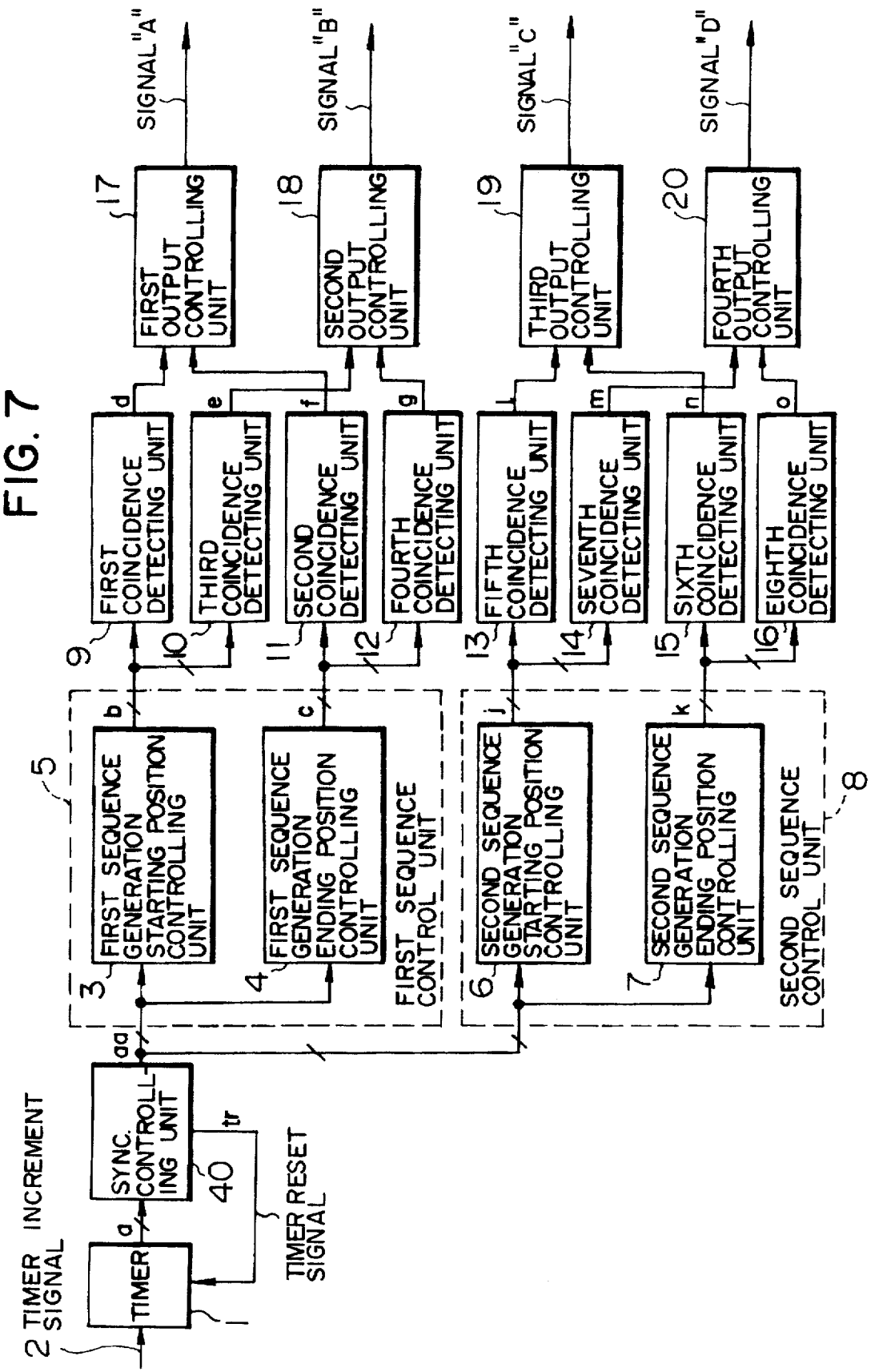
FIG. 7 is a block diagram for indicating an arrangement of a signal generating apparatus according to a third embodiment of the present invention.

As represented in FIG. 7, a signal generating apparatus, according to a third embodiment of the present invention, has a different arrangement from that of the signal generating apparatus according to the first embodiment of the present invention as shown in FIG. 1. That is, a synchronization controlling unit 40 is interposed between the timer 1 and the first and second sequence control units 5 and 8, and this synchronization controlling unit 40 initiates the resetting operation of the timer 1 and outputs a corrected count value "aa" so as to make the count of the timer 1 coincident with the external condition.

Then, a description will now be made of operations of this signal generating apparatus according to the third embodiment with reference to timing charts shown in FIG. 8, FIG. 9, FIG. 10 and FIG. 11. For the sake of simple explanation, the timing of the final output signal is typically represented as the signal "A". It is assumed that the first sequence generation starting position controlling unit 3 and the first sequence generation ending position controlling unit 4, employed in the first sequence control unit 5 output a value identical to the corrected count value "aa" derived from the synchronization controlling unit 40 as a correction value "b" and another correction value "c", respectively. It is also assumed that the first coincidence detecting unit 9 and the second coincidence detecting unit 11 output the coincidence detection pulses "d" and "f" at the fixed timing with respect to the correction values "b" and "c". Accordingly, the first output controlling unit 17 outputs the signal "A" at the fixed timing with respect to the corrected count value "aa".

Figure 8:
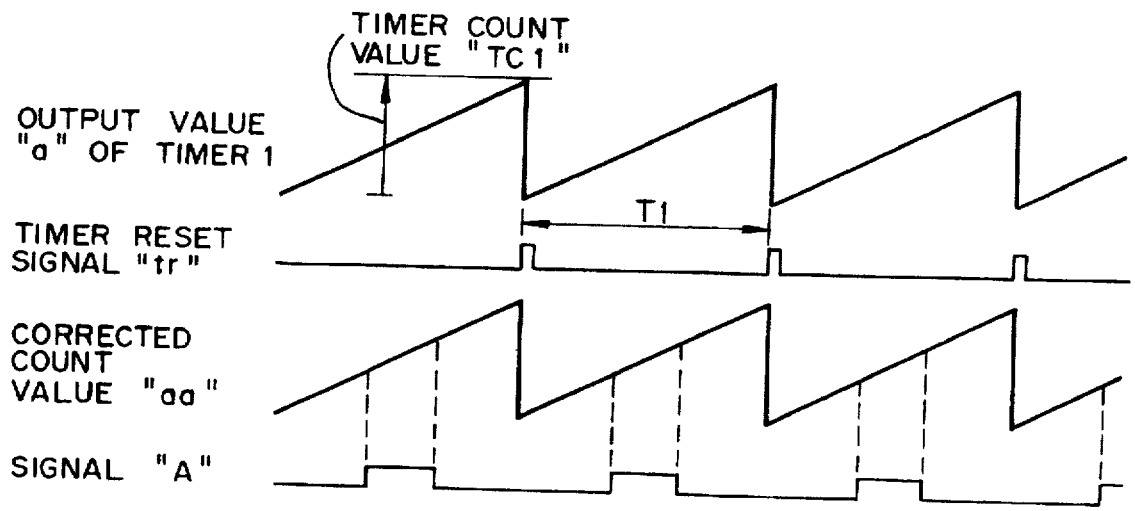
FIG. 8 is a timing chart for describing the normal operation of the signal generating apparatus according to the third embodiment.

FIG. 8 represents a timing of the signal "A" in case that no specific control is carried out in the synchronization controlling unit 40. Every time the count value of the timer 1 takes a constant timer count value "TC1", the synchronization controlling unit 40 outputs a timer reset signal "tr" to the timer 1. As a consequence, the timer 1 repeats the counting operation at a constant period "T1", and the synchronization controlling unit 40 directly outputs the output value of the timer 1 as the corrected count value "aa". Therefore, the signal "A" is generated with keeping the time period of "T1".

Figure 9:
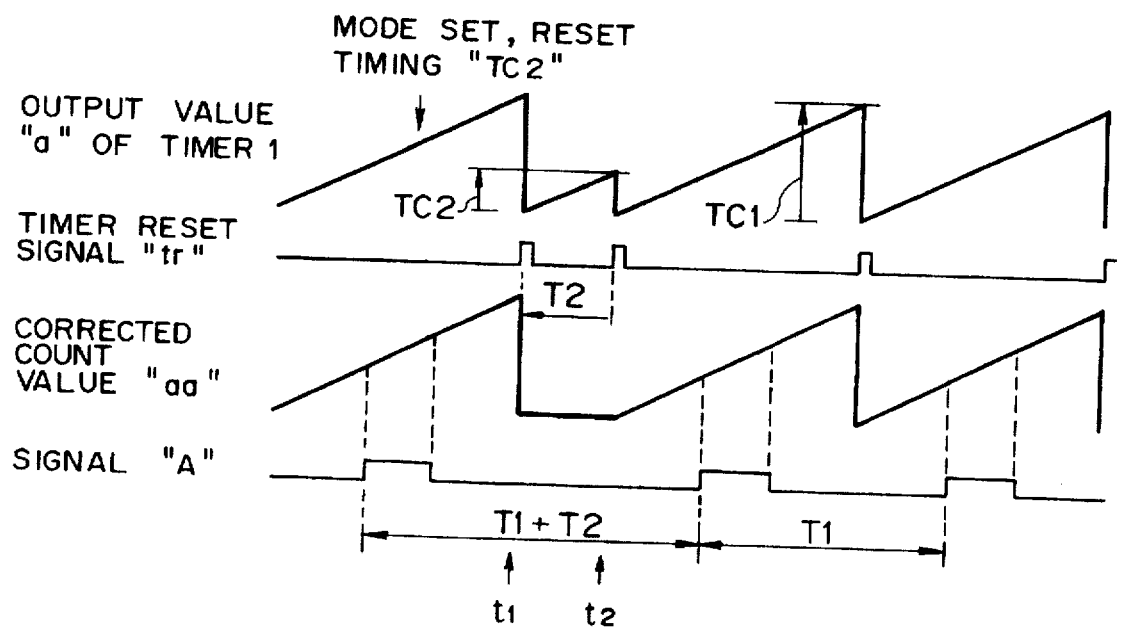
FIG. 9 is a timing chart for explaining such operation when the timing of the signal generating apparatus according to the third embodiment is delayed in the mode 1.

Next, an explanation will now be made of operation for a mode 1 where the generation timing of the signal "A" is delayed by time "T2" in accordance with the externally supplied synchronization correcting condition with reference to the timing chart of FIG. 9.

First, both of the mode "1" and the count value (reset timing "TC2") of the timer 1 corresponding to the time "T2" used to delay the signal "A" are set to the synchronization controlling unit 40. Thereafter, the timer 1 continues the counting operation, and when the output value "a" of the timer 1 reaches the first timer count value "TC1" at time $t_1$, the synchronization controlling unit 40 outputs the timer reset signal "tr" to the timer 1. When the count value of the timer 1 which after the resetting operation, restarts its counting operation from the count value of "0", has reached the reset timing "TC2" at time $t_2$, the synchronization controlling unit 40 again outputs the timer reset signal "tr" to the timer 1. Upon receipt of the timer reset signal "tr", the timer 1 resets the count value and restarts its counting operation from "0". Thereafter, every time the count value of the timer 1 reaches the timer count value "TC1", the synchronization control unit 40 outputs the timer reset signal "tr" and the timer 1 continues its counting operation at a time period of "T1".

While after the output value "a" of the timer 1 has reached the timer count value "TC1" immediately after setting the mode and then the timer 1 has been reset, the output value "a" of the timer 1 has reached the reset timing "TC2" to restart the resetting operation of the timer 1 (namely, a time duration from time $t_1$ to time $t_2$), the synchronization controlling unit 40 continues to output the fixed value "0" (otherwise, timer count value "TC1") as the corrected count value. Thereafter, this synchronization controlling unit 40 outputs the same value as the output value "a" of the timer 1. Since the generation starting timing and the generation ending timing of the signal "A" are measured on the basis of this corrected count value "aa", the signal "A" is delayed by the time "T2" during one time period after the mode setting operation, and the delayed signal "A" is outputted.

Next, operation (mode 2) in case that the generation timing of the signal "A" is advanced, or quickened by the time "T3" in accordance with the externally supplied synchronization correction condition will now be described with reference to the timing chart shown in FIG. 10.

First, both of the mode "2" and a timer count value (reset timing) "TC4" (=TC1-TC3) corresponding to a reset interval "T4" (=T1-T3) used to advance the generation timing of the signal "A" are set to the synchronization controlling unit 40. At this time, it is determined as TC4>TC6 (TC6 indicate the timer count value corresponding to the generation ending position of the signal "A").

When the output value "a" of the timer 1 reaches the timer count value "TC1" at time $t_1$ after the mode setting operation, the synchronization controlling unit 40 resets the timer 1, and then when the output value "a" of the timer 1 reaches the count value "TC4" (i.e., at time $t_2$), again resets the timer 1. Thereafter, the synchronization controlling unit 40 repeats the resetting operation of the timer in the time period of "T1" in the normal operation. During this time duration, the synchronization controlling unit 40 outputs the same value as the output value "a" of the timer 1 as the corrected count value "aa".

Figure 10:
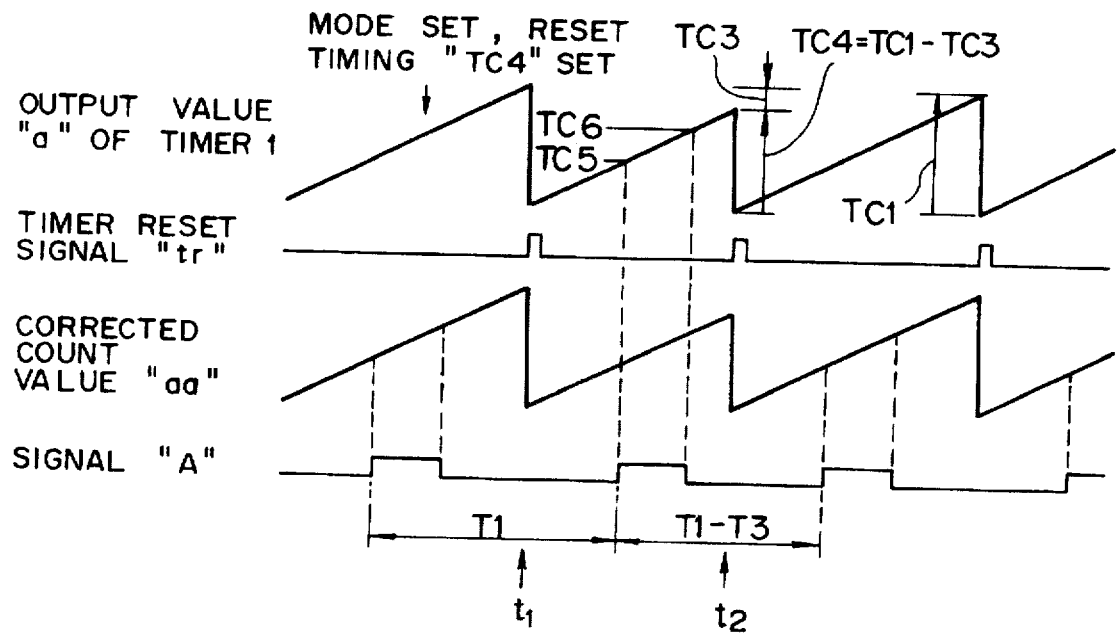
FIG. 10 is a timing chart for explaining such operation when the timing of the signal generating apparatus according to the third embodiment is advanced in the mode 2.

As a result, the signal "A" is raised when the output value "a" of the timer 1 reaches the count value "TC5" (TC5<TC4) and also the signal "A" is lowered when the output value "a" of the timer 1 reaches the count value "TC6" (TC5<TC6<TC4), so that the generation timing of the signal "A" generated at the second timing after the mode setting operation can be quicken by the time "T3", as indicated in FIG. 10.

Figure 11:
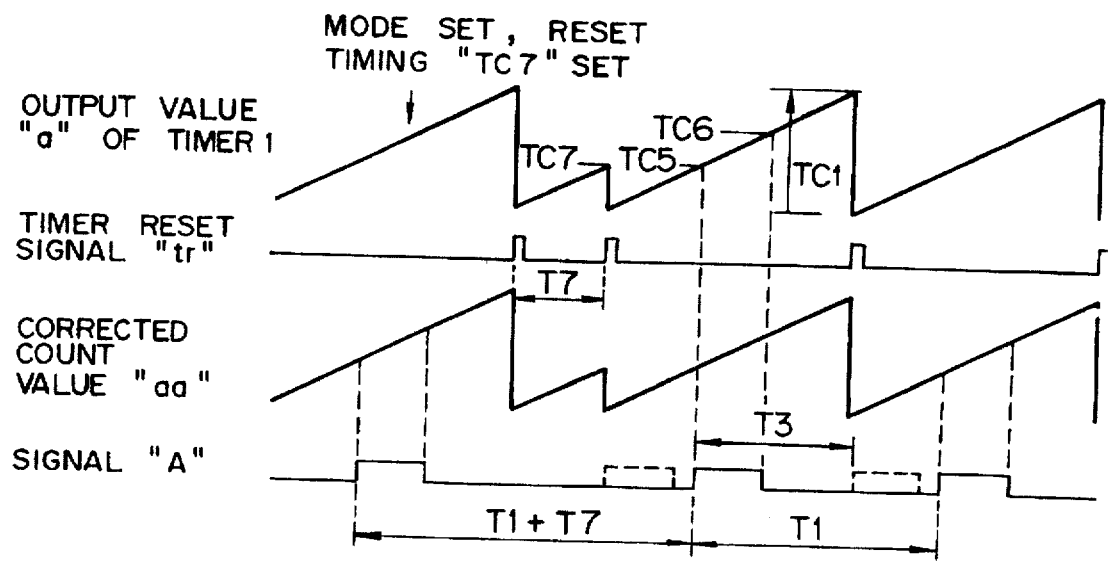
FIG. 11 is a timing chart for explaining such operation that the timing of the signal generating apparatus according to the third embodiment is delayed in the mode 2.

In the mode "2", even when the generation timing of the signal "A" generated at the first timing after the mode setting operation is delayed by the time T7 (=T1-T3), the signal "A" can be produced at the same position, although the generation timing of the signal "A" generated at the second timing after the mod setting operation has been advanced by the time "T3". The operations of the signal generating apparatus at this time will now be explained with employment of the timing chart shown in FIG. 11. Assuming that a count value (namely, reset timing) of the timer 1 for delaying the generation timing of the signal "A" generated at the first timing after the mode setting operation by the time "T7" is selected to be "TC7", the mode "2" is set and also the reset timing "TC7" is set to the synchronization controlling unit 40. At this time, assuming now that the reset timing "TC7" is smaller than the count value "TC5" indicative of the timing at which the signal "A" is raised, since the signal generating apparatus performs the same operation as that of the mode "1" setting operation, as shown in FIG. 9, the generation timing of the signal "A" generated at the first timing after the mode setting operation is delayed by the time T7 from the generation timing when no mode is set. As a consequence, the generation timing of the signal "A" which is produced at the first timing after the mode setting operation is quickened, or advanced by the time "T3" with respect to such a signal "A" on the right side of this drawing among the signals "A" when no mode is set, as illustrated in FIG. 11 by a broken line.

As previously explained, in the signal generating apparatus according to the third embodiment, since the corrected count value "aa" outputted from the synchronization controlling unit 40 is entered into the first sequence control unit 5 and the second sequence control unit 8, the generation timings of all the signals "A", "B", "C", "D" can be changed at the same time.

(FOURTH EMBODIMENT)

Figure 12:
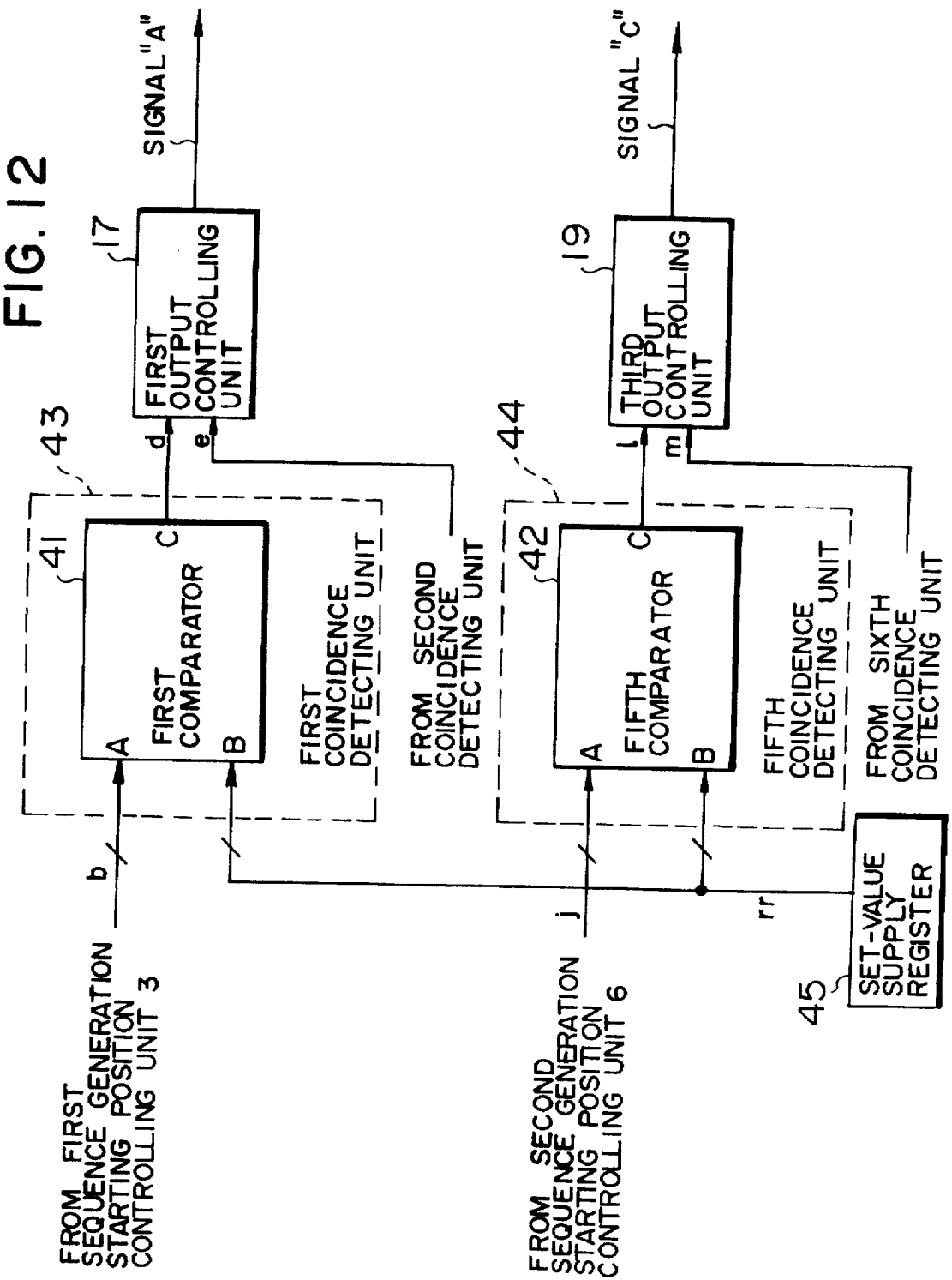
FIG. 12 is a schematic block diagram for indicating an arrangement of a signal generating apparatus according to a fourth embodiment of the present invention.

A signal generating apparatus according to a fourth embodiment of the present invention owns such a different arrangement, as compared with that of the signal generating apparatus according to the first embodiment of the present invention as shown in FIG. 1. That is, two sets of the above-described coincidence detecting units connected to the first sequence generation starting position controlling unit 3, and also two sets of the above-mentioned coincidence detecting units connected to the second sequence generation starting position controlling unit 6 commonly use one set-value supply register, whereas two sets of these coincidence detecting units connected to the first sequence generation ending position controlling unit 4 and also two sets of these coincidence detecting units connected to the second sequence generation starting point controlling unit 7 commonly use the other set-value supply register. As represented in FIG. 12, for instance, both of a first coincidence detecting unit 43 for defining the generation timing of the signal "A", and a fifth coincidence detecting unit 44 for defining the generation timing of the signal "C" commonly use a single piece of set-value supply register 45. The first coincidence detecting unit 43 is constructed of a first comparator 41 which outputs a coincidence detection pulse "d" when the correction value "b" derived from the first sequence generation starting position controlling unit 3 is compared with a predetermined set value "rr" derived from the set-value supply register 45, and then both of these values are coincident with each other. Also, the fifth coincidence detecting unit 44 is constructed of a fifth comparator 42 which outputs a coincidence detection pulse "l" when the correction value "j" derived from the second sequence generation starting position controlling unit 6 is compared with a predetermined set value "rr" derived from the set-value supply register 45, and then both of these values are coincident with each other.

Figure 13:
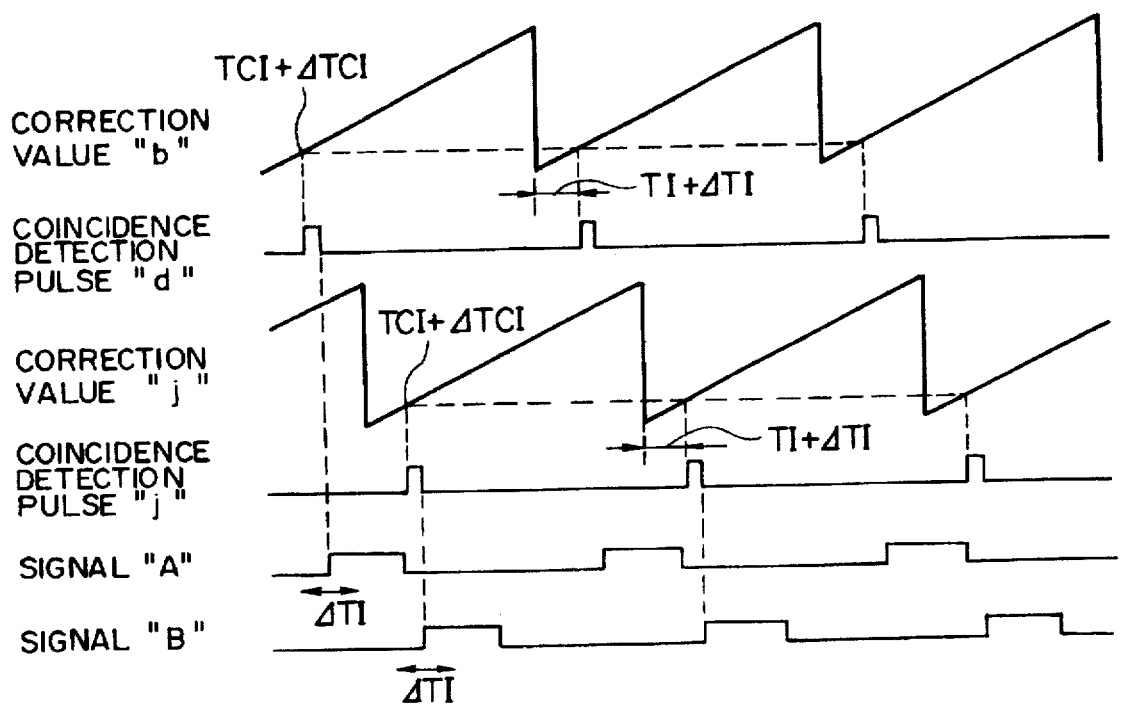
FIG. 13 is a timing chart for explaining operation of the signal generating apparatus according to the fourth embodiment.

A description will now be made of operations of the signal generating apparatus according to the fourth embodiment of the present invention with reference to FIG. 13. To simplify this description, only the signal "A" produced by the first sequence control unit 5 and the signal "C" produced by the second sequence control unit 8 will now be explained. Assuming now that a predetermined set value "rr" set in the set-value supply register 45 corresponds to the count value "TC1", when the correction value "b" derived from the first sequence generation starting position controlling unit 3 is coincident with the count value "TC1" corresponding to the set value "rr" of the set-value supply register 45, the coincidence detection pulse "d" is outputted from the first coincidence detecting unit 43. As a result, the signal "A" is raised, so that the signal "A" is produced. Also, when the correction value "j" derived from the second sequence generation starting position controlling unit 6 is coincident with the count value "TC1" corresponding to the set value "rr" of the set-value supply register 45, the coincidence detection pulse "l" is outputted from the fifth coincidence detecting unit 44. As a result, the signal "C" is raised, so that the signal "C" is produced. At this time, the time duration defined by that the correction value "b" derived from the first sequence generation starting position controlling unit 3 starts from the count value "o" and then reaches the count value "TCT" is equal to the time duration defined by that the correction value "j" derived from the second sequence generation starting position controlling unit 6 starts from the count value "o" and then reaches the count value "TCI". It should be noted that this time duration is assumed as "TT".

Assuming now that the set value "rr" of the set-value supply register 45 is changed from the count value "TCI" to another count value "TCI+ΔTCI", when the correction value "b" is coincident with the count value "TCI+ΔTCI", the coincident detection pulse "d" is outputted from the first coincident detecting unit 43, and also when the correction value "j" is coincident with the count value "TCI+ΔTCI", the coincidence detection pulse "l" is outputted from the fifth coincidence detecting unit 44. As a result, both of the signal "A" and the signal "C" are produced with having such a delay time "ΔTT" required to increase the correction value "b" and the correction value "j" by the count value "ΔTCI", as compared with such a case that the set value "rr" of the set-value supply register 45 is set to the count value "TCI". In other words, the rising timings of the signal "A" and the signal "B" are delayed by the time "ΔTT" from the time "TT".

As previously described, in accordance with the signal generating apparatus of the fourth embodiment, since the coincidence detecting units for the different sequences commonly use the set-value supply register, the timings of the signals "A", "B" and the signals "C", "D", which are produced in the different sequences can be simultaneously changed.

(FIFTH EMBODIMENT)

Figure 14:
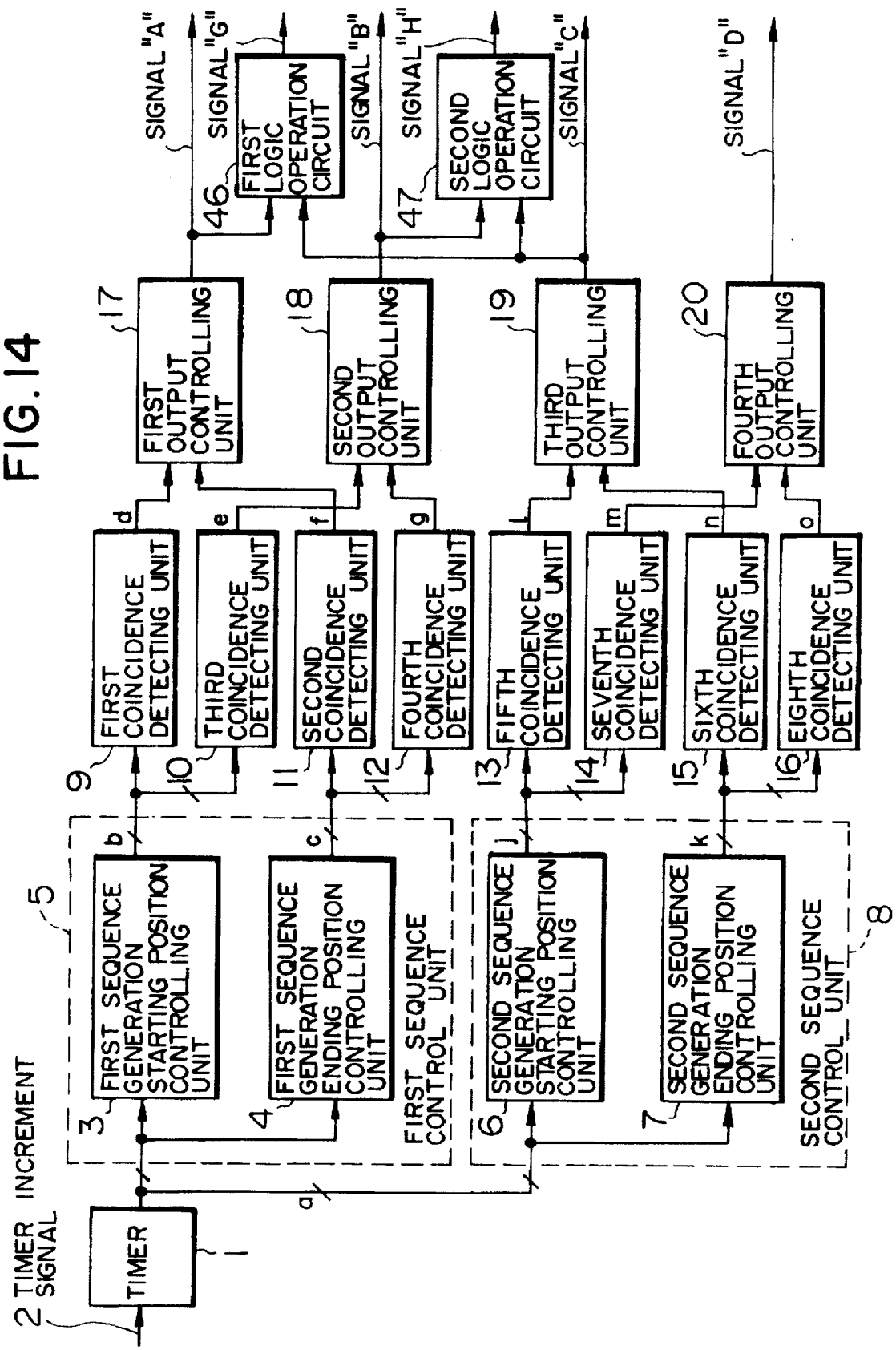
FIG. 14 is a schematic block diagram for indicating an arrangement of a signal generating apparatus according to a fifth embodiment of the present invention.

As illustrated in FIG. 14, a signal generating apparatus, according to a fifth embodiment of the present invention, has such a different arrangement from that of the signal generating apparatus according to the first embodiment, shown in FIG. 1. That is, this signal generating apparatus of the fifth embodiment is comprised of a first logic operation circuit 46 for performing a logic operation between the signal "A" outputted from the first output controlling unit 17 and the signal "C" outputted from the third output controlling unit 19 to produce a signal "G", and a second logic operation circuit 47 for performing a logic operation between the signal "B" outputted from the second output controlling unit 18 and the signal "C" outputted from the third output controlling unit 19 to produce a signal "H".

Figure 15:
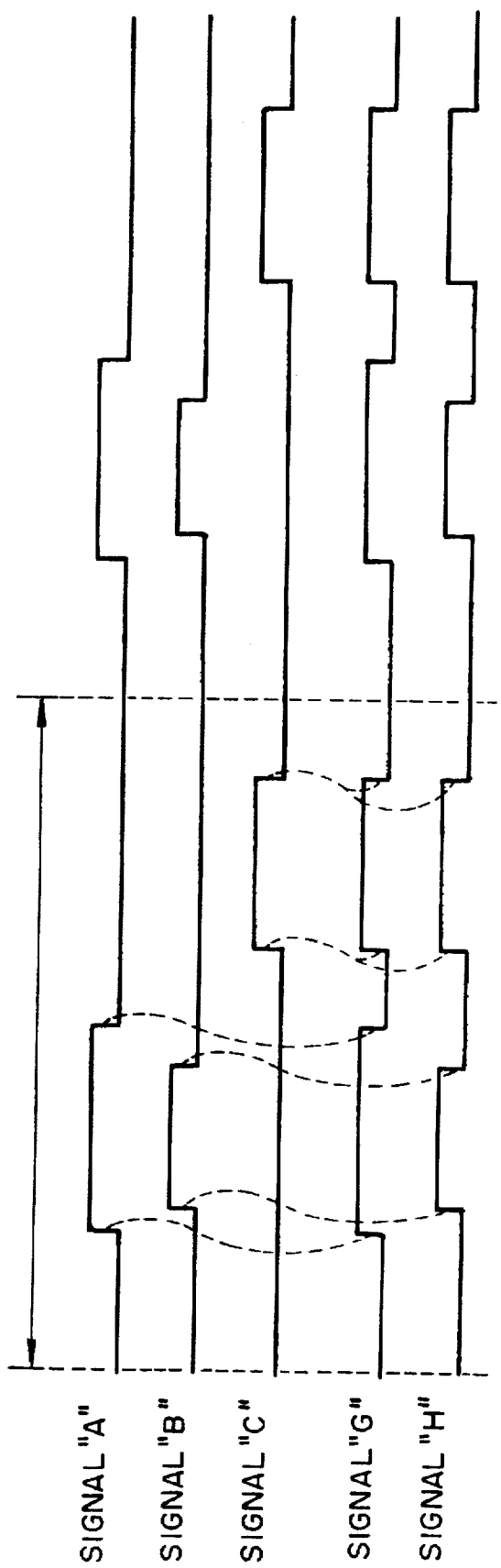
FIG. 15 is a timing chart when an OR-gate circuit is employed in the signal generating apparatus of the fifth embodiment.
Figure 16:
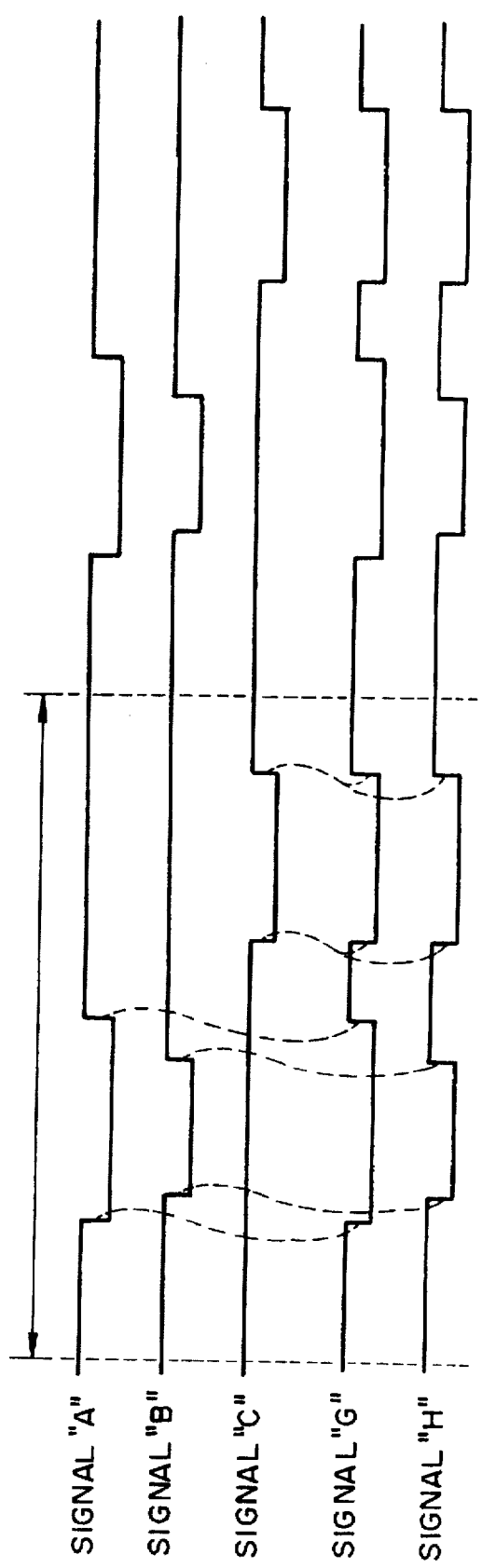
FIG. 16 is a timing chart when an AND-gate circuit is employed in the signal generating apparatus of the fifth embodiment.

FIG. 15 is a timing chart of the signals "A", "B", "C", "G", "H" generated from the signal generating apparatus according to this embodiment when the first logic operation circuit 46 and the second logic operation circuit 47 are OR-gate circuits. In this case, the signal "G" outputted from the first logic operation circuit 46 corresponds to such a signal produced by OR-gating the signal "A" and the signal "C", whereas the signal "H" outputted from the second logic operation circuit 47 corresponds to a signal obtained by OR-gating the signal "B" and the signal "C". As a result, the signal "G" and the signal "H" are raised only two times at a predetermined timing within one time period of the signal "A".

It should be noted that when the signal "D" outputted from the fourth output controlling unit 20 is also inputted into the first logic operation circuit 46 and/or the second logic operation circuit 47, it is possible to obtain such a signal which is raised only three times at a preselected timing during one time period of the signal "A".

In the example shown in FIG. 15, the signals "A" to "D" are such active low signals which become low levels during the normal condition and become high levels during the timing generation. Alternatively, in such a case that these signals "A" to "D" are active low signals which become high levels during the normal operation and become low levels during the timing generation, both of the first logic operation circuit 46 and the second logic operation circuit 47 are constructed of AND-gate circuits, so that it is possible to obtain two signals "G", "H" which are lowered plural times at a preselected timing during one time period of the signal "A".

(SIXTH EMBODIMENT)

Figure 17:
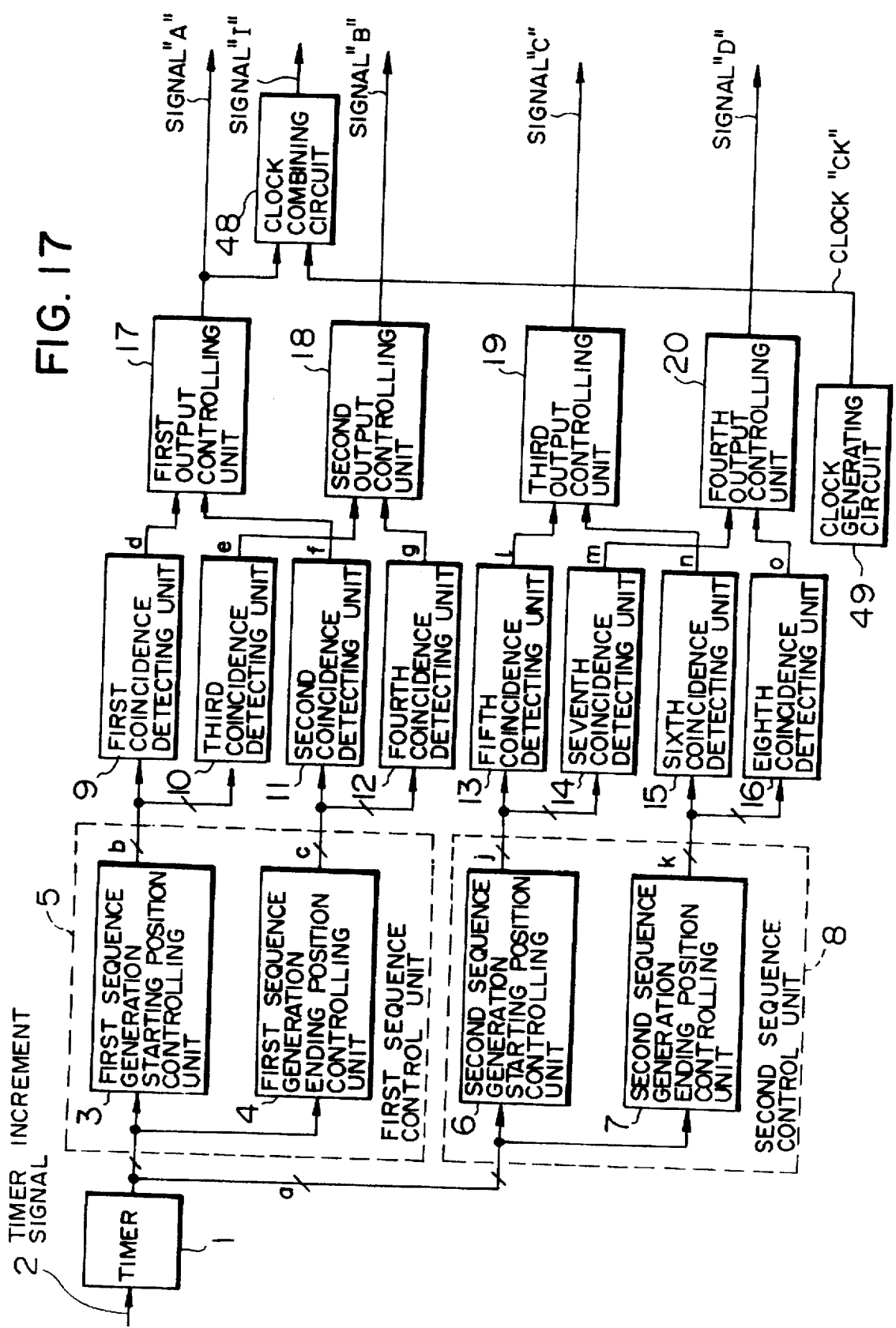
FIG. 17 is a schematic block diagram for showing an arrangement of a signal generating apparatus according to a sixth embodiment of the present invention.

As indicated in FIG. 17, a signal processing apparatus, according to a sixth embodiment of the present invention, has a different arrangement from that of the signal processing apparatus according to the first embodiment of the present invention, shown in FIG. 1. That is, this signal processing apparatus further includes a clock generating circuit 49 for generating a clock "CK", and a clock combining circuit 48 for combining the signal "A" outputted from the first output controlling unit 17 with the clock "CK" outputted from the clock generating circuit 49 to produce a signal "T". The clock combining circuit 48 is arranged by such a logic operation circuit as an OR-gate circuit and an AND-gate circuit, and a circuit unit for suppressing hazard caused by timing shifts between the signal "A" and the clock "CK" while the signal "A" is combined with the clock "CK".

Figure 18:
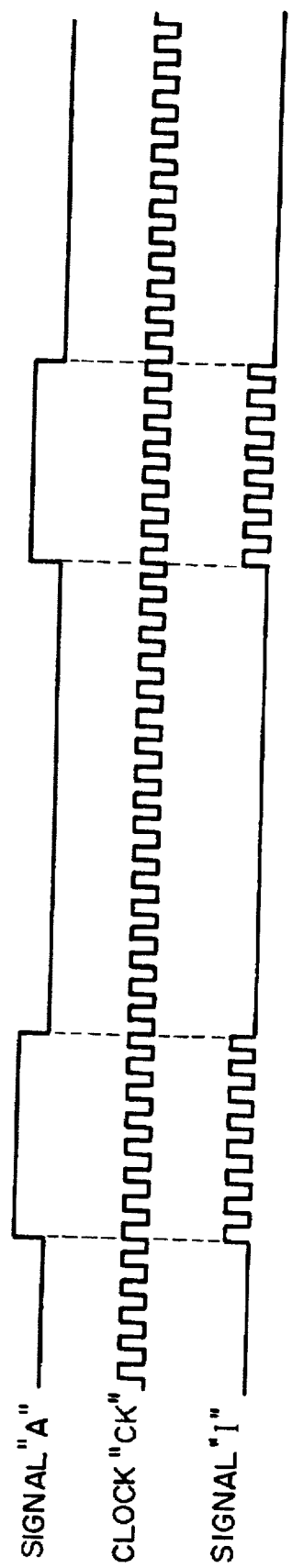
FIG. 18 is a timing chart for explaining operation of the signal generating apparatus of the sixth embodiment.

For instance, when the signal "A" is an active-high signal, the logic operation unit of the clock combining circuit 48 is arranged by an AND-gate circuit, so that as illustrated in the timing chart of FIG. 18, such a signal "T" having the same waveform as that of the clock "CK" only during the high-level period of the signal "A" can be generated.

(SEVENTH EMBODIMENT)

Figure 19:
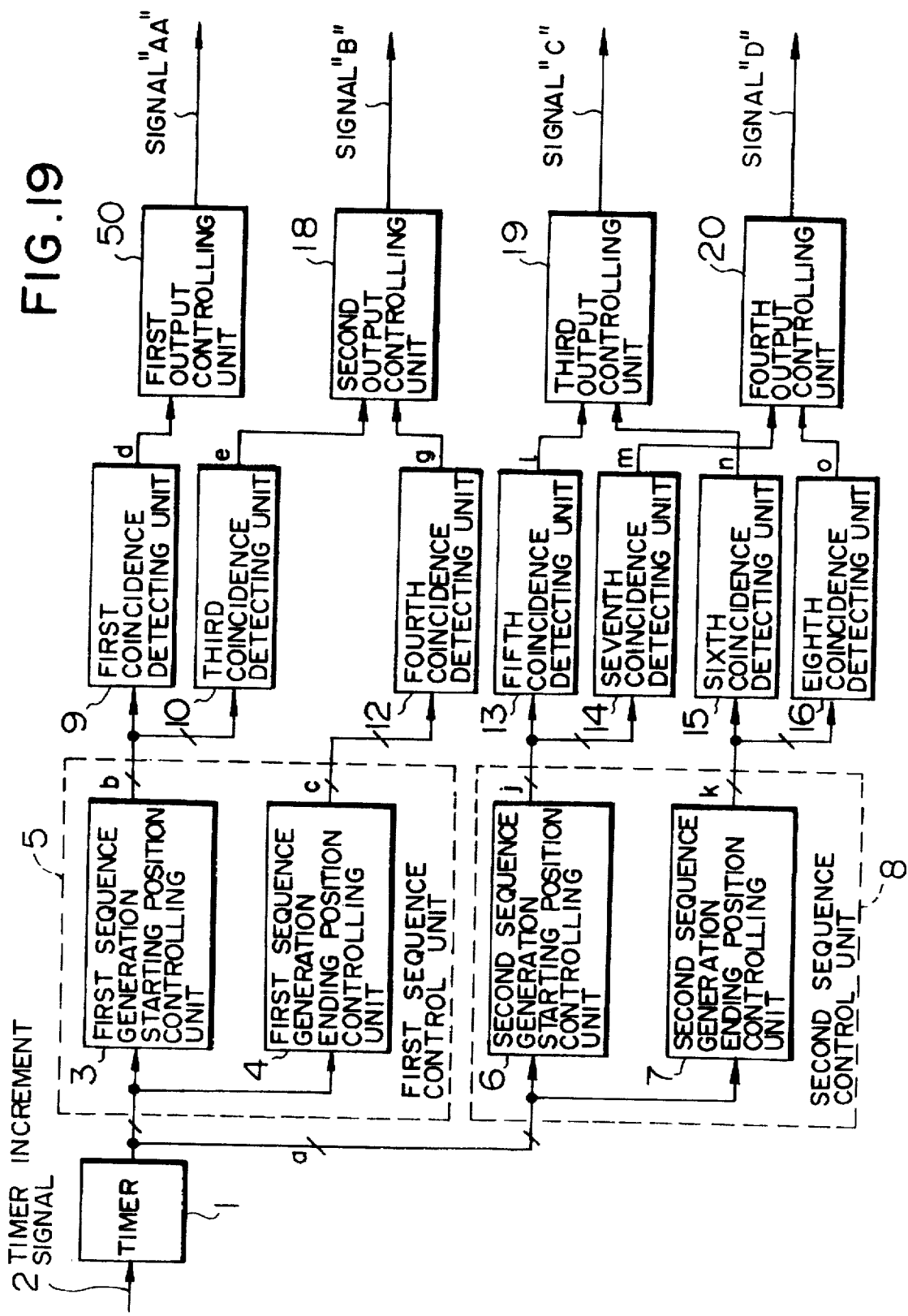
FIG. 19 is a schematic block diagram for indicating an arrangement of a signal generating apparatus according to a seventh embodiment of the present invention.
Figure 20:
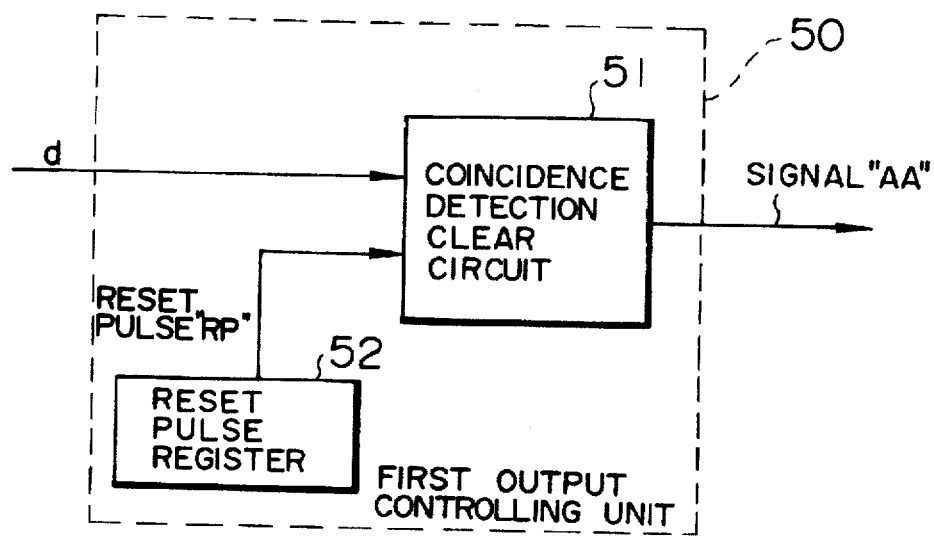
FIG. 20 is a schematic block diagram for showing a concrete arrangement of the output controlling unit employed in the signal generating apparatus of the seventh embodiment.

As shown in FIG. 19, a signal generating apparatus, according to a seventh embodiment of the present invention, owns the following different circuit arrangement, as compared with that of the signal generating apparatus indicated in FIG. 1, according to the first embodiment of the present invention. That is, the first output controlling unit 50 contains a reset pulse register 52 for outputting a reset pulse "RP" when a predetermined numeral value is written into this reset pulse register 52, starts to generate the signal "A" when the coincident detection pulse "d" from the first coincidence detecting unit 9 is entered therein, and completes to generate the signal "AA" when the reset pulse "RP" is outputted from the reset pulse register 52. In other words, as represented in FIG. 20, the first output controlling unit 50 of the signal generating apparatus according to this embodiment is constructed of the reset pulse register 52 for producing the reset pulse "RP" when "o" is written into this reset pulse register, and also a coincidence detection clear circuit 51 for raising the signal "AA" when the coincidence detection pulse "d" is inputted from the first coincident detecting unit 9 and for lowering the signal "AA" when the reset pulse "RP" is outputted from the reset pulse register 52.

Figure 21:
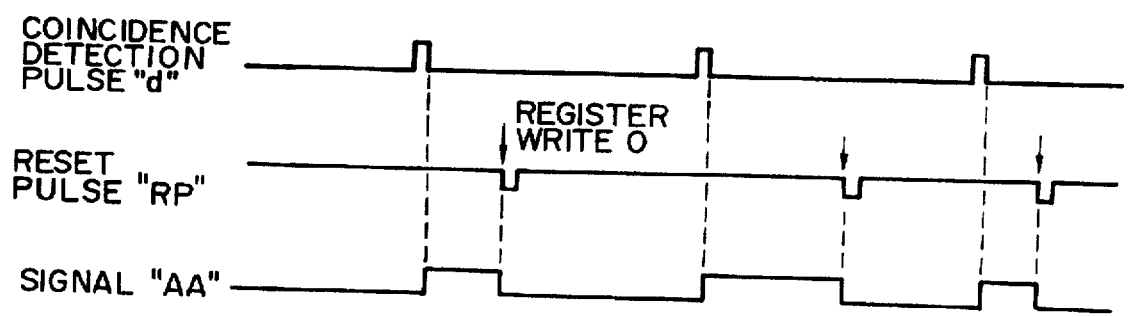
FIG. 21 is a timing chart for explaining operation of the signal generating apparatus according to the seventh embodiment.
Figure 22:
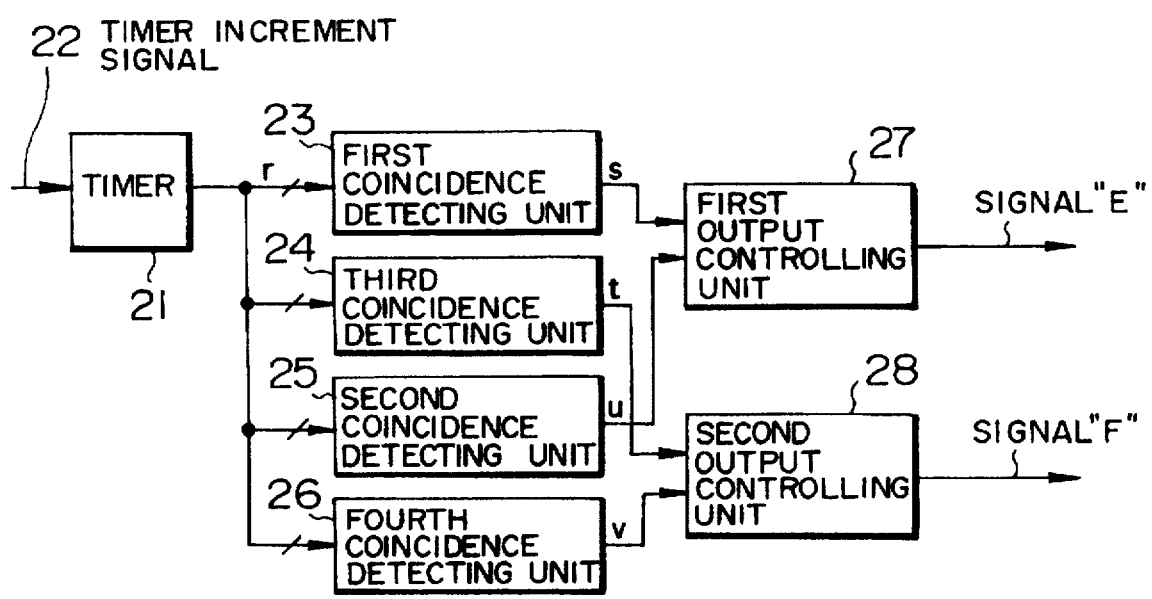
FIG. 22 is a schematic block diagram for indicating the arrangement of the conventional signal generating apparatus.
Figure 23:
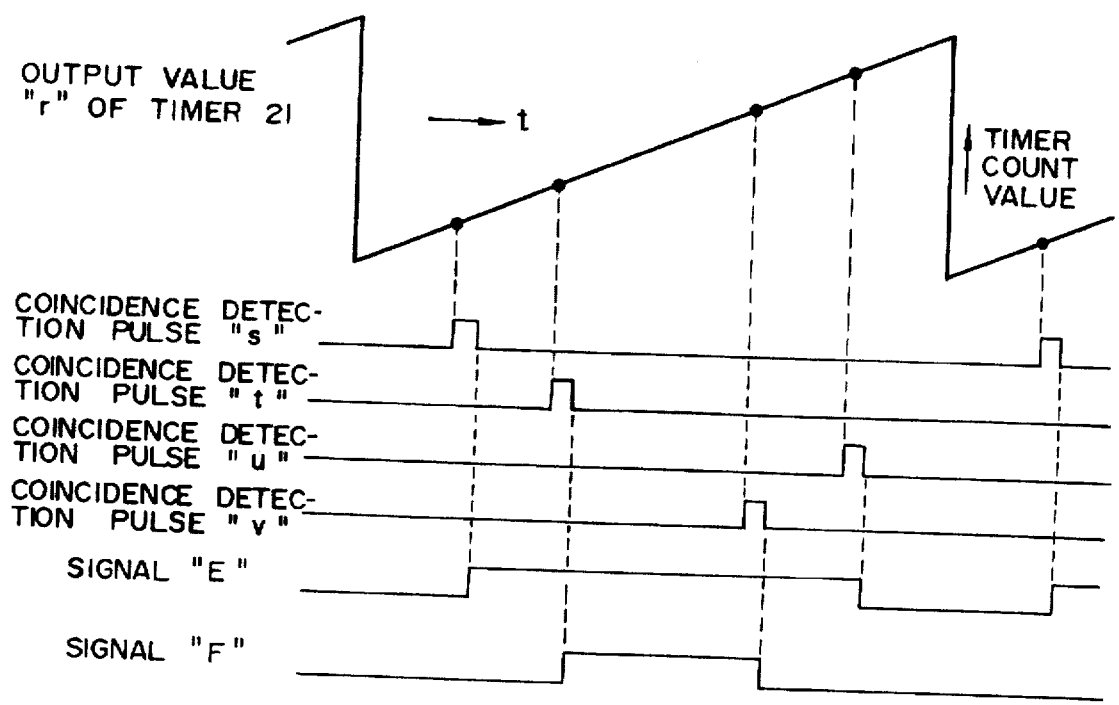
FIG. 23 is a timing chart for explaining operation of the conventional signal generating apparatus.

Subsequently, operation of the signal generating apparatus according to the seventh embodiment will now be described with reference to the timing chart of FIG. 21. When the coincidence detection pulse "d" of the active-high signal is inputted from the first coincidence detecting circuit 9, the coincidence detection clear circuit 51 of the first output controlling unit 50 raises the signal "AA" in synchronism with falling of the coincidence detection pulse "d". Thereafter, when "o" is directly written into the reset pulse register 52 from a central processing unit (CPU), the reset pulse register 52 produces the reset pulse "RP" of the active-low signal. Upon receipt of the reset pulse "RP", the coincidence detection clear circuit 51 causes the signal "AA" to fall in synchronism with lowering of the reset pulse "RP". As a result, the signal "AA" of the active-high signal is produced.

As a result, since in the signal generating apparatus of this embodiment, raising of the signal "AA" can be controlled by the coincidence detection pulse "d" and also lowering of the signal "AA" can be controlled by writing a predetermined numeral value (for example, "o") into the reset pulse register 52, this signal generating apparatus may be employed as an apparatus for periodically generating an interrupt signal to a CPU. With employment of such a signal generating apparatus, the interrupt signal to the CPU can be periodically produced in response to the coincidence detection pulse. Furthermore, when the interrupt process is ended, the CPU will write "o" into the reset pulse register 52 so as to accomplish the generation of the interrupt signal, so that the interruption to the CPU can be released.

(EMBODIMENT OF WIRELESS MOBILE APPARATUS)

Figure 24:
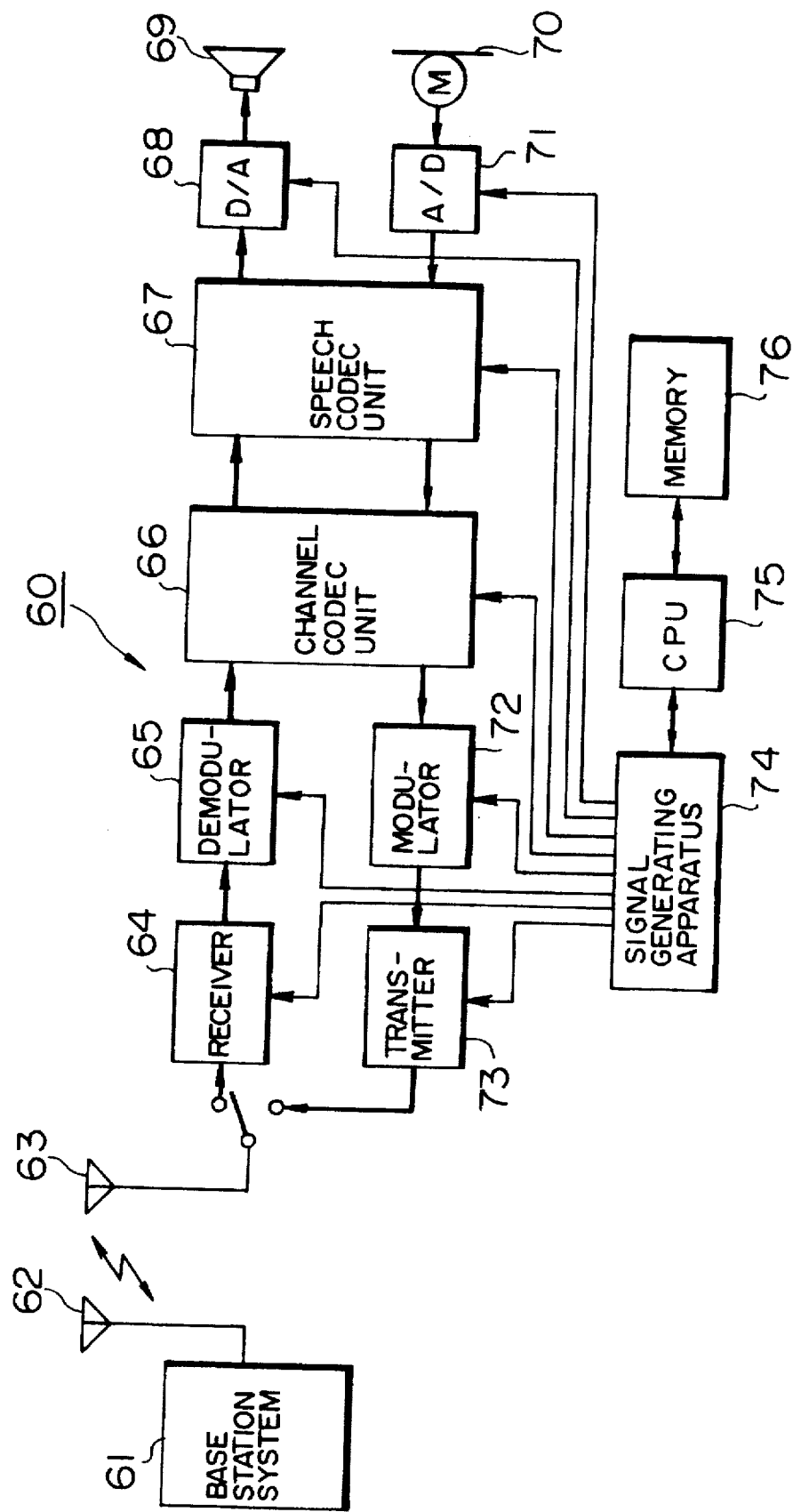
FIG. 24 is a schematic block diagram for representing an arrangement of a wireless mobile system according to an embodiment of the present invention.

FIG. 24 is a schematic block diagram for representing an arrangement of a wireless (radio) mobile apparatus according to an embodiment of the present invention. The wireless mobile apparatus 60 according to this embodiment is such a radio mobile system for transmitting and receiving the signals to/from a base station system 61 including a base station antenna 62, which includes an antenna 63 receives the electromagnetic waves transmitted from the base station system 61. The radio mobile apparatus 60 is arranged by as a reception unit thereof, a receiver 64 for receiving a signal, which is contains a baseband signal and is transmitted from the base station system 61, and also for extracting the baseband signal from the received signal; a demodulator 65 for demodulating the extracted baseband signal to reproduce a data series synchronized with the base station system 61; and a channel codec unit 66 functioning as an error correction decoding means for executing error correction decoding operation to the reproduced data series. The radio mobile apparatus 60 further includes a speech codec unit 67 functioning as an audio decoding means for decoding such audio data when the error-correction decoded data series corresponds to the audio data; a D/A converter 68 for digital-to-analog-converting the decoded audio data into an audio (voice) signal; and a speaker 69 for outputting the converted audio signal as a voice. The radio mobile apparatus 60 is arranged by as a transmission unit, a microphone 70 for converting voice into an audio (voice) signal; an A/D converter 71 for analog-to-digital-converting the converted audio signal into audio data; the speech codec unit 67 functioning also as an audio encoding means for encoding the converted audio data; and the channel codec unit 66 functioning also as an error correction encoding means for error-correction encoding the encoded audio data. This radio mobile apparatus 60 further includes a modulator 72 for modulating the error-correction encoded audio data with a transmission carrier; and a transmitter 74 for transmitting the modulated audio data to the base station apparatus 61. Furthermore, the radio mobile apparatus 60 is constructed of a control unit, a signal generating apparatus 74 for generating timing signals used to perform the signal transmitting/receiving operation of the radio mobile apparatus 60; a central processing unit (CPU) 75 for controlling the signal transmitting/receiving operation of the radio mobile apparatus 60; and a memory 76 for storing therein command data and control data used to the central processing unit 75. It should be noted that the above-described signal generating apparatus 74 owns a similar arrangement to that of one of the above-explained signal generating apparatuses according to the first to seventh embodiments of the present invention.

Figure 25:
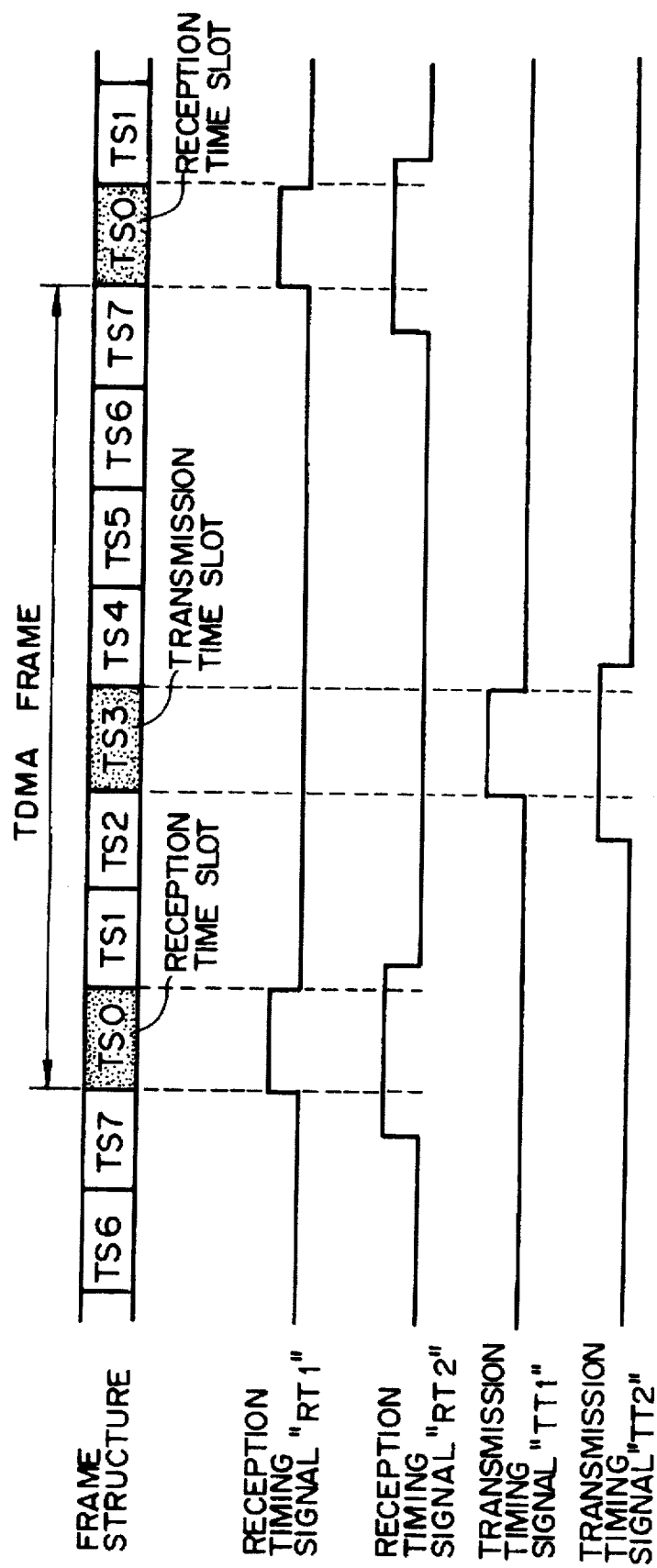
FIG. 25 is a timing chart for explaining a frame structure of the wireless mobile system and operation of a signal generating apparatus employed in the wireless mobile system according to the embodiment.

In FIG. 25, there is shown an example of a frame structure defined between the base station system 61 and the radio mobile apparatus 60, two sets of reception timing signals "RT1", "RT2" generated by the signal generating apparatus 74, and two sets of transmission timing signals "TT1", "TT2". Referring now to FIG. 25, operations of the signal generating apparatus 74 employed in the radio mobile apparatus 60 will be described.

In the frame structure shown in FIG. 25, a single TDMA (Time Division Multiple Access) frame is constructed of eight time slots "TS0" to "TS7". Among them, the time slot "TS0" is used as a reception time slot of the radio mobile apparatus 60, whereas the time slot "TS3" is used as a transmission time slot of the radio mobile apparatus 60. In such a frame structure, both the transmitting operation and the receiving operation of the radio mobile apparatus 60 are carried out in the time divisional manner. The signal generating apparatus 74 generates the reception timing signals "RT1", "RT2" at a timing located near the reception time slot, which will then be supplied to the receiver 64 and the demodulator 65, and also generates the transmission timing signals "TT1", "TT2" at a timing located near the transmission time slot, which will then be supplied to the modulator 72 and the transmitter 73. Even when the timings of the reception time slot/transmission time slot are varied, both the reception timing signals "RT1", "RT2" and the transmission timing signals "TT1", "TT2" may be generated at proper timings in accordance with the operations as previously explained in the signal generating apparatuses according to the first to seventh embodiments of the present invention by employing the signal generating apparatus 74 having an arrangement similar to that of one of the first to seventh signal generating apparatuses of the present invention. It should be understood that this signal generating apparatus 74 is controlled by the CPU 75.

What is claimed is:

1. A signal generating apparatus for generating a signal whose generation starting timing and generation ending timing are controlled, comprising:

a timer for producing a timer output value by incrementing or decrementing a count value in response to a clock signal;

control means having first correction means and second correction means, said first correction means correcting said timer output value to produce a first correction value, and said second correction means correcting said timer output value to produce a second correction value which is different from said first correction value;

first coincidence detecting means for comparing said first correction value and a first set value to output a first coincidence detection pulse when said first correction value is coincident with said first set value;

second coincidence detecting means for comparing said second correction value and a second set value to output a second coincidence detection pulse when said second correction value is coincident with said second set value; and output control means for controlling the generation starting timing of said signal in response to said first coincidence detection pulse, and for controlling the generation ending timing of said signal in response to said second coincidence detection pulse.

2. A signal generating apparatus as claimed in claim 1, wherein:

said first correction means includes:

a first register for storing a third set value; and a first subtractor for subtracting said third set value from said timer output value to produce said first correction value; and said second correction means includes:
   a second register for storing a fourth set value; and
   a second subtractor for subtracting said fourth set value from said timer output value to produce said second correction value.

3. A signal generating apparatus as claimed in claim 1, further comprising synchronization control means for resetting a count value of said timer in order that the count value of said timer is synchronized with an external condition.

4. A signal generating apparatus as claimed in claim 1 further comprising:
   clock generating means for generating another clock signal; and
   clock logic operation means for performing a logic operation between an output signal of said output control means and said another clock signal to obtain a signal for controlling at lease one of the generation starting time and the generation ending time.

5. A signal generating apparatus as claimed in claim 1, further comprising a second output control means for controlling the generation starting timing of said signal in response to said first coincidence detection pulse, wherein:
   said second output control means includes a reset pulse register for outputting a reset pulse when a predetermined numeral value is written into said reset pulse register by a central processing unit and means for controlling the generation ending timing of said signal in response to said reset pulse.

6. A signal generating apparatus for generating a signal whose generation starting timing and generation ending timing are controlled, comprising:
   a timer for producing a timer output value by incrementing or decrementing a count value in response to a clock signal;
   control means having first correction means and second correction means, said first correction means correcting said timer output value to produce a first correction value, and said second correction means correcting said first correction value to produce a second correction value which is different from said first correction value;
   first coincidence detecting means for comparing said first correction value and a first set value to output a first coincidence detection pulse when said first correction value is coincident with said first set value;
   second coincidence detecting means for comparing said second correction value and a second set value to output a second coincidence detection pulse when said second correction value is coincident with said second set value; and
   output control means for controlling the generation starting timing of said signal in response to said first coincidence detection pulse, and for controlling the generation ending timing of said signal in response to said second coincidence detection pulse.

7. A signal generating apparatus as claimed in claim 6, wherein:
   said first correction means includes:
      a first register for storing a third set value; and
      a first subtractor for subtracting said third set value from said timer output value to produce said first correction value; and
   said second correction means includes:
      a second register for storing a fourth set value; and
      a second subtractor for subtracting said fourth set value from said first correction value to produce said second correction value.

8. A signal generating apparatus as claimed in claim 6, further comprising synchronization control means for resetting a count value of said timer in order that the count value of said timer is synchronized with an external condition.

9. A signal generating apparatus as claimed in claim 6, further comprising:
   clock generating means for generating another clock signal; and
   clock logic operation means for performing a logic operation between an output signal of said output control means and said another clock signal to obtain a signal for controlling at lease one of the generation starting time and the generation ending time.

10. A signal generating apparatus as claimed in claim 6, further comprising a second output control means for controlling the generation starting timing of said signal in response to said first coincidence detection pulse, wherein:
   said second output control means includes a reset pulse register for outputting a reset pulse when a predetermined numeral value is written into said reset pulse register by a central processing unit and means for controlling the generation ending timing of said signal in response to said reset pulse.

11. A signal generating apparatus for generating first and second signals whose generation starting timings and generation ending timings are controlled, comprising:
   a timer for producing a timer output value by incrementing or decrementing a count value in response to a clock signal;
   control means having first correction means and second correction means, said first correction means correcting said timer output value to produce a first correction value, and said second correction means correcting said timer output value to produce a second correction value which is different from said first correction value;
   first coincidence detecting means for comparing said first correction value and a first set value to output a first coincidence detection pulse when said first correction value is coincident with said first set value;
   second coincidence detecting means for comparing said second correction value and a second set value to output a second coincidence detection pulse when said second correction value is coincident with said second set value;
   third coincidence detecting means for comparing said first correction value and a third set value to output a third coincidence detection pulse when said first correction value is coincident with said third set value;
   fourth coincidence detecting means for comparing said second correction value and a fourth set value to output a fourth coincidence detection pulse when said second correction value is coincident with said fourth set value;
   first output control means for controlling the generation starting timing of said first signal in response to said first coincidence detection pulse, and for controlling the generation ending timing of said first signal in response to said second coincidence detection pulse; and
   second output control means for controlling the generation starting timing of said second signal in response to said third coincidence detection pulse, and for controlling the generation ending timing of said second signal in response to said fourth coincidence detection pulse.

12. A signal generating apparatus for generating first and second signals whose generation starting timings and generation ending timings are controlled, comprising:

a timer for producing a timer output value by incrementing or decrementing a count value in response to a clock signal;

first control means having first correction means and second correction means, said first correction means correcting said timer output value to produce a first correction value, and said second correction means correcting said timer output value to produce a second correction value which is different from said first correction value;

second control means having third correction means and fourth correction means, said third correction means correcting said timer output value to produce a third correction value, and said fourth correction means correcting said timer output value to produce a fourth correction value which is different from said third correction value;

first coincidence detecting means for comparing said first correction value and a first set value to output a first coincidence detection pulse when said first correction value is coincident with said first set value;

second coincidence detecting means for comparing said second correction value and a second set value to output a second coincidence detection pulse when said second correction value is coincident with said second set value;

third coincidence detecting means for comparing said third correction value and a third set value to output a third coincidence detection pulse when said third correction value is coincident with said third set value;

fourth coincidence detecting means for comparing said fourth correction value and a fourth set value to output a fourth coincidence detection pulse when said fourth correction value is coincident with said fourth set value;

first output control means for controlling the generation starting timing of said first signal in response to said first coincidence detection pulse, and for controlling the generation ending timing of said first signal in response to said second coincidence detection pulse; and second output control means for controlling the generation starting timing of said second signal in response to said third coincidence detection pulse, and for controlling the generation ending timing of said second signal in response to said fourth coincidence detection pulse.

13. A signal generating apparatus claimed in claim 12, wherein:

said first set value and said third set value have a same value; and said signal generating apparatus further comprises a set-value supplying register for supplying said first and third set values to said first and third coincidence detecting means.

14. A signal generating apparatus claimed in claim 13, wherein:

said second set value and said fourth set value have a same value; and said signal generating apparatus further comprises another set-value supplying register for supplying said second and fourth set values to said second and fourth coincidence detecting means.

15. A signal generating apparatus for generating first and second signals whose generation starting timings and generation ending timings are controlled, comprising:

a timer for producing a timer output value by incrementing or decrementing a count value in response to a clock signal;

first control means having first correction means and second correction means, said first correction means correcting said timer output value to produce a first correction value, and said second correction means correcting said first correction value to produce a second correction value which is different from said first correction value;

first coincidence detecting means for comparing said first correction value and a first set value to output a first coincidence detection pulse when said first correction value is coincident with said first set value;

second coincidence detecting means for comparing said second correction value and a second set value to output a second coincidence detection pulse when said second correction value is coincident with said second set value;

third coincidence detecting means for comparing said first correction value and a third set value to output a third coincidence detection pulse when said first correction value is coincident with said third set value;

fourth coincidence detecting means for comparing said second correction value and a fourth set value to output a fourth coincidence detection pulse when said second correction value is coincident with said fourth set value;

first output control means for controlling the generation starting timing of said first signal in response to said first coincidence detection pulse, and for controlling the generation ending timing of said first signal in response to said second coincidence detection pulse; and second output control means for controlling the generation starting timing of said second signal in response to said third coincidence detection pulse, and for controlling the generation ending timing of said second signal in response to said fourth coincidence detection pulse.

16. A signal generating apparatus for generating first and second signals whose generation starting timings and generation ending timings are controlled, comprising:

a timer for producing a timer output value by incrementing or decrementing a count value in response to a clock signal;

first control means having first correction means and second correction means, said first correction means correcting said timer output value to produce a first correction value, and said second correction means correcting said first correction value to produce a second correction value which is different from said first correction value;

second control means having third correction means and fourth correction means, said third correction means correcting said timer output value to produce a third correction value, and said fourth correction means correcting said third correction value to produce a fourth correction value which is different from said third correction value;

first coincidence detecting means for comparing said first correction value and a first set value to output a first coincidence detection pulse when said first correction value is coincident with said first set value;

second coincidence detecting means for comparing said second correction value and a second set value to output a second coincidence detection pulse when said second correction value is coincident with said second set value;

third coincidence detecting means for comparing said third correction value and a third set value to output a third coincidence detection pulse when said third correction value is coincident with said third set value;

fourth coincidence detecting means for comparing said fourth correction value and a fourth set value to output a fourth coincidence detection pulse when said fourth correction value is coincident with said fourth set value;

first output control means for controlling the generation starting timing of said first signal in response to said first coincidence detection pulse, and for controlling the generation ending timing of said first signal in response to said second coincidence detection pulse; and second output control means for controlling the generation starting timing of said second signal in response to said third coincidence detection pulse, and for controlling the generation ending timing of said second signal in response to said fourth coincidence detection pulse.

17. A signal generating apparatus claimed in claim 16 wherein:

said first set value and said third set value have a same value; and said signal generating apparatus further comprises a set-value supplying register for supplying said first and third set values to said first and third coincidence detecting means.

18. A signal generating apparatus claimed in claim 17 wherein:

said second set value and said fourth set value have a same value; and said signal generating apparatus further comprises another set-value supplying register for supplying said second and fourth set values to said second and fourth coincidence detecting means.

19. A wireless mobile apparatus for transmitting/receiving a signal to/from a base station system, comprising:

receiving means for receiving a signal which contains a baseband signal and is transmitted from said base station system, and for extracting the baseband signal from the received signal;

demodulating means for demodulating said extracted baseband signal to reproduce a data series synchronized with said base station system;

error correction decoding means for error-correction-decoding said reproduced data series;

audio decoding means for decoding audio data when said error-correction-decoded data series is such audio data;

digital-to-analog converting means for digital-to-analog-converting said decoded audio data into an audio signal;

speaker means for outputting said converted audio signal as an output voice;

a microphone for converting received voice into a converted audio signal;

analog-to-digital converting means for analog-to-digital-converting said converted audio signal into converted audio data;

audio coding means for coding said converted audio data to produce coded audio data;

error correction coding means for error-correction-coding said coded audio data to produce error-correction-coded audio data;

modulating means for modulating said error-correction-coded audio data with a transmission carrier to produce modulated audio data;

transmitting means for transmitting said modulated audio data to said base station system;

signal generating means for generating a timing signal used for performing a transmitting/receiving operation in said wireless mobile apparatus;

a central processing unit for controlling the transmitting/receiving operation of said wireless mobile apparatus; and a memory for storing command and control data for said central processing unit; wherein:

said signal generating means is a signal generating means for generating said timing signal whose rising timing and trailing timing are controlled, and comprises:

a timer for producing a timer output value by incrementing or decrementing a count value in response to a clock signal;

control means having first correction means and second correction means, said first correction means correcting said timer output value to produce a first correction value, and said second correction means correcting said timer output value to produce a second correction value which is different from said first correction value;

first coincidence detecting means for comparing said first correction value and a first set value to output a first coincidence detection pulse when said first correction value is coincident with said first set value;

second coincidence detecting means for comparing said second correction value and a second set value to output a second coincidence detection pulse when said second correction value is coincident with said second set value; and output control means for controlling the rising timing of said timing signal in response to said first coincidence detection pulse, and for controlling the trailing timing of said timing signal in response to said second coincidence detection pulse.

20. A wireless mobile apparatus as claimed in claim 19, wherein said signal generating means further comprises synchronization control means for resetting a count value of said timer in order that the count value of said timer is synchronized with an external condition.

21. A wireless mobile apparatus as claimed in claim 19, wherein:

said signal generating means further comprises:

clock generating means for generating another clock signal; and clock logic operation means for performing a logic operation between an output signal of said output control means and said another clock signal to obtain a signal for controlling at lease one of the rising time and the trailing time.

22. A wireless mobile apparatus as claimed in claim 19, wherein:

said signal generating means further comprises second output control means for controlling the trailing timing of said timing signal in response to said first coincidence detection pulse, wherein:

said second output control means includes a reset pulse register for outputting a reset pulse when a predetermined numeral value is written into said reset pulse register by a central processing unit and means for controlling the trailing timing of said timing signal in response to said reset pulse.

23. A wireless mobile apparatus for transmitting/receiving a signal to/from a base station system, comprising:

receiving means for receiving a signal which contains a baseband signal and is transmitted from Said base station system, and for extracting the baseband signal from the received signal;

demodulating means for demodulating said extracted baseband signal to reproduce a data series synchronized with said base station system;

error correction decoding means for error-correction-decoding said reproduced data series;

audio decoding means for decoding audio data when said error-correction-decoded data series is such audio data;

digital-to-analog converting means for digital-to-analog-converting said decoded audio data into an audio signal;

speaker means for outputting said converted audio signal as an output voice;

a microphone for converting a received voice into a converted audio signal;

analog-to-digital converting means for analog-to-digital-converting said converted audio signal into converted audio data;

audio coding means for coding said converted audio data to produce coded audio data;

error correction coding means for error-correction-coding said coded audio data to produce error-correction-coded audio data;

modulating means for modulating said error-correction-coded audio data with a transmission carrier to produce modulated audio data;

transmitting means for transmitting said modulated audio data to said base station system;

signal generating means for generating a timing signal used for performing a transmitting/receiving operation in said wireless mobile apparatus;

a central processing unit for controlling the transmitting/receiving operation of said wireless mobile apparatus; and a memory for storing command and control data for said central processing unit, wherein:

said signal generating means is a signal generating means for generating said timing signal whose rising timing and trailing timing are controlled, and comprises:

a timer for producing a timer output value by incrementing or decrementing a count value in response to a clock signal;

control means having first correction means and second correction means, said first correction means correcting said timer output value to produce a first correction value, and said second correction means correcting said first correction value to produce a second correction value which is different from said first correction value;

first coincidence detecting means for comparing said first correction value and a first set value to output a first coincidence detection pulse when said first correction value is coincident with said first set value;

second coincidence detecting means for comparing said second correction value and a second set value to output a second coincidence detection pulse when said second correction value is coincident with said second set value; and output control means for controlling the rising timing of said timing signal in response to said first coincidence detection pulse, and for controlling the trailing timing of said timing signal in response to said second coincidence detection pulse.

24. A wireless mobile apparatus for transmitting/receiving a signal to/from a base station system, comprising:

receiving means for receiving a signal which contains a baseband signal and is transmitted from said base station system, and for extracting the baseband signal from the received signal;

demodulating means for demodulating said extracted baseband signal to reproduce a data series synchronized with said base station system;

error correction decoding means for error-correction-decoding said reproduced data series;

audio decoding means for decoding audio data when said error-correction-decoded data series is such audio data;

digital-to-analog converting means for digital-to-analog-converting said decoded audio data into an audio signal;

speaker means for outputting said converted audio signal as an output voice;

a microphone for converting received voice into a converted audio signal;

analog-to-digital converting means for analog-to-digital-converting said converted audio signal into converted audio data;

audio coding means for coding said converted audio data to produce coded audio data;

error correction coding means for error-correction-coding said coded audio data to produce error-correction-coded audio data;

modulating means for modulating said error-correction-coded audio data with a transmission carrier to produce modulated audio data;

transmitting means for transmitting said modulated audio data to said base station system;

signal generating means for generating a timing signal used for performing a transmitting/receiving operation in said wireless mobile apparatus;

a central processing unit for controlling the transmitting/receiving operation of said wireless mobile apparatus; and a memory for storing command and control data for said central processing unit, wherein:

said signal generating means is a signal generating means for generating first and second timing signals whose rising timings and trailing timings are controlled, and comprises:

a timer for producing a timer output value by incrementing or decrementing a count value in response to a clock signal;

control means having first correction means and second correction means, said first correction means correcting said timer output value to produce a first correction value, and said second correction means correcting said timer output value to produce a second correction value which is different from said first correction value;

first coincidence detecting means for comparing said first correction value and a first set value to output a first coincidence detection pulse when said first correction value is coincident with said first set value;

second coincidence detecting means for comparing said second correction value and a second set value to output a second coincidence detection pulse when said second correction value is coincident with said second set value;

third coincidence detecting means for comparing said first correction value and a third set value to output a third coincidence detection pulse when said first correction value is coincident with said third set value;

fourth coincidence detecting means for comparing said second correction value and a fourth set value to output a fourth coincidence detection pulse when said second correction value is coincident with said fourth set value;

first output control means for controlling the rising timing of said first timing signal in response to said first coincidence detection pulse, and for controlling the trailing timing of said first timing signal in response to said second coincidence detection pulse; and second output control means for controlling the rising timing of said second timing signal in response to said third coincidence detection pulse, and for controlling the trailing timing of said second timing signal in response to said fourth coincidence detection pulse.

25. A wireless mobile apparatus for transmitting/receiving a signal to/from a base station system, comprising:

receiving means for receiving a signal which contains a baseband signal and is transmitted from said base station system, and for extracting the baseband signal from the received signal;

demodulating means for demodulating said extracted baseband signal to reproduce a data series synchronized with said base station system;

error correction decoding means for error-correction-decoding said reproduced data series;

audio decoding means for decoding audio data when said error-correction-decoded data series is such audio data;

digital-to-analog converting means for digital-to-analog-converting said decoded audio data into an audio signal;

speaker means for outputting said converted audio signal as an output voice;

a microphone for converting received voice into a converted audio signal;

analog-to-digital converting means for analog-to-digital-converting said converted audio signal into converted audio data;

audio coding means for coding said converted audio data to produce coded audio data;

error correction coding means for error-correction-coding said coded audio data to produce error-correction-coded audio data;

modulating means for modulating said error-correction-coded audio data with a transmission carrier to produce modulated audio data;

transmitting means for transmitting said modulated audio data to said base station system;

signal generating means for generating a timing signal used for performing a transmitting/receiving operation in said wireless mobile apparatus;

a central processing unit for controlling the transmitting/receiving operation of said wireless mobile apparatus; and a memory for storing command and control data for said central processing unit, wherein:

said signal generating means is a signal generating means for generating first and second timing signals whose rising timings and trailing timings are controlled, and comprises:

a timer for producing a timer output value by incrementing or decrementing a count value in response to a clock signal;

control means having first correction means and second correction means, said first correction means correcting said timer output value to produce a first correction value, and said second correction means correcting said first correction value to produce a second correction value which is different from said first correction value;

first coincidence detecting means for comparing said first correction value and a first set value to output a first coincidence detection pulse when said first correction value is coincident with said first set value;

second coincidence detecting means for comparing said second correction value and a second set value to output a second coincidence detection pulse when said second correction value is coincident with said second set value;

third coincidence detecting means for comparing said first correction value and a third set value to output a third coincidence detection pulse when said third correction value is coincident with said third set value;

fourth coincidence detecting means for comparing said second correction value and a fourth set value to output a fourth coincidence detection pulse when said fourth correction value is coincident with said fourth set value;

first output control means for controlling the rising timing of said first timing signal in response to said first coincidence detection pulse, and for controlling the trailing timing of said first timing signal in response to said second coincidence detection pulse; and second output control means for controlling the rising timing of said second timing signal in response to said third coincidence detection pulse, and for controlling the trailing timing of said second timing signal in response to said fourth coincidence detection pulse.

26. A wireless mobile apparatus for transmitting/receiving a signal to/from a base station system, comprising:

receiving means for receiving a signal which contains a baseband signal and is transmitted from said base station system, and for extracting the baseband signal from the received signal;

demodulating means for demodulating said extracted baseband signal to reproduce a data series synchronized with said base station system;

error correction decoding means for error-correction-decoding said reproduced data series;

audio decoding means for decoding audio data when said error-correction-decoded data series is such audio data;

digital-to-analog converting means for digital-to-analog-converting said decoded audio data into an audio signal;

speaker means for outputting said converted audio signal as an output voice;

a microphone for converting received voice into a converted audio signal;

analog-to-digital converting means for analog-to-digital-converting said converted audio signal into converted audio data;

audio coding means for coding said converted audio data to produce coded audio data;

error correction coding means for error-correction-coding said coded audio data to produce error-correction-coded audio data;

modulating means for modulating said error-correction-coded audio data with a transmission carrier to produce modulated audio data;

transmitting means for transmitting said modulated audio data to said base station system;

signal generating means for generating a timing signal used for performing a transmitting/receiving operation in said wireless mobile apparatus;

a central processing unit for controlling the transmitting/receiving operation of said wireless mobile apparatus; and a memory for storing command and control data for said central processing unit, wherein:

said signal generating means is a signal generating means for generating first and second timing signals whose rising timings and trailing timings are controlled, and comprises:

a timer for producing a timer output value by incrementing or decrementing a count value in response to a clock signal;

first control means having first correction means and second correction means, said first correction means correcting said timer output value to produce a first correction value, and said second correction means correcting said timer output value to produce a second correction value which is different from said first correction value;

second control means having third correction means and fourth correction means, said third correction means correcting said timer output value to produce a third correction value, and said fourth correction means correcting said timer output value to produce a fourth correction value which is different from said third correction value;

first coincidence detecting means for comparing said first correction value and a first set value to output a first coincidence detection pulse when said first correction value is coincident with said first set value;

second coincidence detecting means for comparing said second correction value and a second set value to output a second coincidence detection pulse when said second correction value is coincident with said second set value;

third coincidence detecting means for comparing said third correction value and a third set value to output a fourth coincidence detection pulse when said third correction value is coincident with said third set value;

fourth coincidence detecting means for comparing said fourth correction value and a fourth set value to output a fourth coincidence detection pulse when said fourth correction value is coincident with said fourth set value;

first output control means for controlling the rising timing of said first timing signal in response to said first coincidence detection pulse, and for controlling the trailing timing of said first timing signal in response to said second coincidence detection pulse; and second output control means for controlling the rising timing of said second timing signal in response to said third coincidence detection pulse, and for controlling the trailing-timing of said second timing signal in response to said fourth coincidence detection pulse.

27. A wireless mobile apparatus claimed in claim 26, wherein:

said first set value and said third set value have a same value; and said signals generating means further comprises a set-value supplying register for supplying said first and third set values to said first and third coincidence detecting means.

28. A wireless mobile apparatus claimed in claim 27, wherein:

said second set value and said fourth set value have a same value; and said signal generating means further comprises another set value supplying register for supplying said second and fourth set values to said second and fourth coincidence detecting means.

29. A wireless mobile apparatus for transmitting/receiving a signal to/from a base station system, comprising:

receiving means for receiving a signal which contains a baseband signal and is transmitted from said base station system, and for extracting the baseband signal from the received signal;

demodulating means for demodulating said extracted baseband signal to reproduce a data series synchronized with said base station system;

error correction decoding means for error-correction-decoding said reproduced data series;

audio decoding means for decoding audio data when said error-correction-decoded data series is such audio data;

digital-to-analog converting means for digital-to-analog-converting said decoded audio data into an audio signal;

speaker means for outputting said converted audio signal as an output voice;

a microphone for converting received voice into a converted audio signal;

analog-to-digital converting means for analog-to-digital-converting said converted audio signal into converted audio data;

audio coding means for coding said converted audio data to produce coded audio data;

error correction coding means for error-correction-coding said coded audio data to produce error-correction-coded audio data;

modulating means for modulating said error-correction-coded audio data with a transmission carrier to produce modulated audio data;

transmitting means for transmitting said modulated audio data to said base station system;

signal generating means for generating a timing signal used for performing a transmitting/receiving operation in said wireless mobile apparatus;

a central processing unit for controlling the transmitting/receiving operation of said wireless mobile apparatus; and a memory for storing command and control data for said central processing unit, wherein:

said signal generating means is a signal generating means for generating first and second timing signals whose rising timings and trailing timings are controlled, and comprises:

a timer for producing a timer output value by incrementing or decrementing a count value in response to a clock signal;

first control means having first correction means and second correction means, said first correction means correcting said timer output value to produce a first correction value, and said second correction means correcting said first correction value to produce a second correction value which is different from said first correction value;

second control means having third correction means and fourth correction means, said third correction means correcting said timer output value to produce a third correction value, and said fourth correction means correcting said third correction value to produce a fourth correction value which is different from said third correction value;

first coincidence detecting means for comparing said first correction value and a first set value to output a first coincidence detection pulse when said first correction value is coincident with said first set value;

second coincidence detecting means for comparing said second correction value and a second set value to output a second coincidence detection pulse when said second correction value is coincident with said second set value;

third coincidence detecting means for comparing said third correction value and a third set value to output a third coincidence detection pulse when said third correction value is coincident with said third set value;

fourth coincidence detecting means for comparing said fourth correction value and a fourth set value to output a fourth coincidence detection pulse when said fourth correction value is coincident with said fourth set value;

first output control means for controlling the rising timing of said first timing signal in response to said first coincidence detection pulse, and for controlling the trailing timing of said first timing signal in response to said second coincidence detection pulse; and second output control means for controlling the rising timing of said second timing signal in response to said third coincidence detection pulse, and for controlling the trailing timing of said second timing signal in response to said fourth coincidence detection pulse.

30. A wireless mobile apparatus claimed in claim 29, wherein:

said first set value and said third set value have a same value; and said signal generating means further comprises set-value supplying register for supplying said first and third set values to said first and third coincidence detecting means.

31. A wireless mobile apparatus claimed in claim 30, wherein:

said second set value and said fourth set value have a same value; and said signal generating means further comprises another set-value supplying register for supplying said second and fourth set values to said second and fourth coincidence detecting means.

32. A signal generating apparatus for generating a signal whose generation starting timing and generation ending timing are controlled, comprising:

a timer for producing a timer output value by incrementing or decrementing a count value in response to a clock signal;

control means, receiving said timer output value, for producing a first correction value, and a second correction value which is different from said first correction value;

first coincidence detecting means for comparing said first correction value and a first set value to output a first coincidence detection pulse when said first correction value is coincident with said first set value;

second coincidence detecting means for comparing said second correction value and a second set value to output a second coincidence detection pulse when said second correction value is coincident with said second set value; and output control means for controlling the generation starting timing of said signal in response to said first coincidence detection pulse, and for controlling the generation ending timing of said signal in response to said second coincidence detection pulse.

33. A wireless mobile apparatus for transmitting/receiving a signal to/from a base station system, comprising:

receiving means for receiving a signal which contains a baseband signal and is transmitted from said base station system, and for extracting the baseband signal from the received signal;

demodulating means for demodulating said extracted baseband signal to reproduce a data series synchronized with said base station system;

error correction decoding means for error-correction-decoding said reproduced data series;

audio decoding means for decoding audio data when said error-correction-decoded data series is such audio data;

digital-to-analog converting means for digital-to-analog-converting said decoded audio data into an audio signal;

speaker means for outputting said converted audio signal as an output voice;

a microphone for converting received voice into a converted audio signal;

analog-to-digital converting means for analog-to-digital-converting said converted audio signal into converted audio data;

audio coding means for coding said converted audio data to produce coded audio data;

error correction coding means for error-correction-coding said coded audio data to produce error-correction-coded audio data;

modulating means for modulating said error-correction-coded audio data with a transmission carrier to produce modulated audio data;

transmitting means for transmitting said modulated audio data to said base station system;

signal generating means for generating a timing signal used for performing a transmitting/receiving operation in said wireless mobile apparatus;

a central processing unit for controlling the transmitting/receiving operation of said wireless mobile apparatus; and a memory for storing command and control data for said central processing unit; wherein:

said signal generating means is a signal generating means for generating said timing signal whose rising timing and trailing timing are controlled, and comprises:

a timer for producing a timer output value by incrementing or decrementing a count value in response to a clock signal;

control means, receiving said timer output value, for producing a first correction value, and a second correction value which is different from said first correction value;

first coincidence detecting means for comparing said first correction value and a first set value to output a first coincidence detection pulse when said first correction value is coincident with said first set value;

second coincidence detecting means for comparing said second correction value and a second set value to output a second coincidence detection pulse when said second correction value is coincident with said second set value; and output control means for controlling the rising timing of said timing signal in response to said first coincidence detection pulse, and for controlling the trailing timing of said timing signal in response to said second coincidence detection pulse.

* * * * *